US008278957B2

(12) United States Patent
Sakata et al.

(10) Patent No.: US 8,278,957 B2
(45) Date of Patent: Oct. 2, 2012

(54) CIRCUIT BOARD UNIT AND TESTING APPARATUS

(75) Inventors: Hiroshi Sakata, Saitama (JP); Ken Miyata, Gunma (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/784,333

(22) Filed: May 20, 2010

(65) Prior Publication Data
US 2010/0301889 A1 Dec. 2, 2010

Related U.S. Application Data

(63) Continuation of application No. PCT/JP2009/001938, filed on Apr. 28, 2009.

(51) Int. Cl.
G01R 31/00 (2006.01)
(52) U.S. Cl. .......... 324/756.04; 324/756.07; 324/755.08
(58) Field of Classification Search .......... 324/754.01, 324/754.03, 754.07–754.2, 755.01–755.11, 324/756.01–756.07
See application file for complete search history.

(56) References Cited

U.S. PATENT DOCUMENTS

| | | | |
|---|---|---|---|
| 6,104,183 A | 8/2000 | Kobayashi et al. | |
| 6,166,553 A * | 12/2000 | Sinsheimer | 324/756.05 |
| 6,265,888 B1 * | 7/2001 | Hsu | 324/750.05 |
| 6,275,051 B1 | 8/2001 | Bachelder et al. | |
| 6,384,593 B1 | 5/2002 | Kobayashi et al. | |
| 6,720,787 B2 * | 4/2004 | Kimura et al. | 324/755.09 |
| 6,762,612 B2 * | 7/2004 | Yu et al. | 324/750.17 |
| 6,853,205 B1 * | 2/2005 | Cheng et al. | 324/755.05 |
| 6,998,858 B2 * | 2/2006 | Sawada et al. | 324/750.22 |
| 7,038,474 B2 * | 5/2006 | McGinnis et al. | 324/754.23 |
| 7,129,730 B2 * | 10/2006 | Liu et al. | 324/750.25 |
| 7,245,137 B2 * | 7/2007 | Eldridge et al. | 324/754.07 |

(Continued)

FOREIGN PATENT DOCUMENTS

JP H09-043309 A 2/1997

(Continued)

OTHER PUBLICATIONS

The explanation of circumstances concerning the accelerated examination dated Apr. 28, 2009, PCT/JP2009/001938 (parent application) submitted to Japanese Patent Office has been submitted via previous IDS on Oct. 15, 2010. Concise explanation of relevance is submitted hereby. This submission is a partial translation of the explanation of circumstances concerning the accelerated examination states Foreign Patent document JP2006-278949 and JP_H09-043309, which have been submitted in a previous IDS.

(Continued)

*Primary Examiner* — Joshua Benitez Rosario
(74) *Attorney, Agent, or Firm* — Chen Yoshimura LLP

(57) ABSTRACT

Provided is a circuit board unit for connecting a connecting terminal of a testing apparatus to a connected terminal of a device under test, including: a circuit board having, on one surface, a contact corresponding to the connected terminal; and a connector guide provided on the one surface of the circuit board, the connector guide guiding a connector having the connecting terminal to the circuit board, and pulling the connector towards the circuit board. In this circuit board unit, the connector guide may bias the connector on a side of the connecting terminal, towards the circuit board. Moreover in the circuit board unit, the circuit board may further have a substrate frame that is coupled to the connector guide and biases the connector guide towards the circuit board.

18 Claims, 25 Drawing Sheets

U.S. PATENT DOCUMENTS

| | | | |
|---|---|---|---|
| 7,312,618 B2 * | 12/2007 | Eldridge et al. | 324/750.04 |
| 7,405,582 B2 * | 7/2008 | Mineo et al. | 324/754.08 |
| 7,471,078 B2 * | 12/2008 | Hobbs et al. | 324/750.16 |
| 7,724,006 B2 * | 5/2010 | Kasukabe et al. | 324/754.07 |
| 7,956,627 B2 * | 6/2011 | Kasukabe et al. | 324/750.22 |
| 2001/0050567 A1 | 12/2001 | Bachelder et al. | |
| 2005/0264308 A1 * | 12/2005 | Jun | 324/754 |

FOREIGN PATENT DOCUMENTS

| | | |
|---|---|---|
| JP | 2001-358187 A | 12/2001 |
| JP | 2006-278949 A | 10/2006 |

OTHER PUBLICATIONS

International Search Report (ISR) issued in PCT/JP2009/001938 (parent application) mailed in May 2009 for Examiner consideration, citing U.S. Patent Application Publication No. US2001/0050567 and Foreign Patent document Nos. JP2006-278949 and JP2001-358187 which have been submitted with Japanese ISR in a previous IDS.

International Search Report (ISR) for PCT/JP20091001938 (parent application) mailed on May 2009 for Examiner consideration. Concise Explanation of Relevance: This ISR cites U.S. Patent Application Publication No. 1 and Foreign Patent document Nos. 1-2 listed above as category A: "document defining the general state of the art which is not considered to be of particular relevance".

Written Opinion (PCT/ISA/237) issued in PCT/JP2009/001938 (parent application) mailed on May 2009. Concise Explanation of Relevance: This Written Opinion considers the claims are not described by or obvious over the Foreign Patent document Nos. 1-2 cited in ISR above.

The explanation of circumstances concerning the accelerated examination dated Apr. 28, 2009, PCT/JP2009/001938 (parent application) submitted to Japanese Patent Office. Concise Explanation of Relevance: This document citing Foreign Patent document Nos. 1 and 3 listed above.

* cited by examiner

CIRCUIT BOARD UNIT AND TESTING APPARATUS

BACKGROUND

1. Technical Field

The present invention relates to a circuit board unit and a testing apparatus.

2. Related Art

Japanese Patent Application Publication No. 2006-278949 describes an inspection apparatus for collectively inspecting a plurality of semiconductor integrated circuits formed on a single wafer, whereby improving the productivity by reducing the inspection time for each piece of wafer.

As the improvement of integration level as well as size increase of substrates, the size of a test target in testing in a single substrate has also become large. However, if the test circuits and the contact terminals are provided in the same number as that of the semiconductor integrated circuits, the size of the testing apparatuses will become large. This causes the testing apparatus to get larger and more expensive, to adversely affect the production cost of the semiconductor apparatuses.

SUMMARY

Therefore, it is an object of an aspect of the innovations herein to provide an circuit board unit and a testing apparatus, which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary circuit board unit is a circuit board unit for connecting a connecting terminal of a testing apparatus to a connected terminal of a device under test, including: a circuit board having, on one surface, a contact corresponding to the connected terminal; and a connector guide provided on the one surface of the circuit board, the connector guide guiding a connector having the connecting terminal to the circuit board, and pulling the connector towards the circuit board.

According to an aspect related to the innovations herein, one exemplary testing apparatus is a testing apparatus for testing a device under test on a wafer, including: a connector having a connecting terminal for connecting a test circuit to a connected terminal of the device under test; and a circuit board unit that electrically connects the connecting terminal to the connected terminal, where the circuit board unit includes: a circuit board having, on one surface, a contact corresponding to the connected terminal; and a connector guide provided on the one surface of the circuit board, the connector guide guiding the connector to the circuit board, and pulling the connector towards the circuit board.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
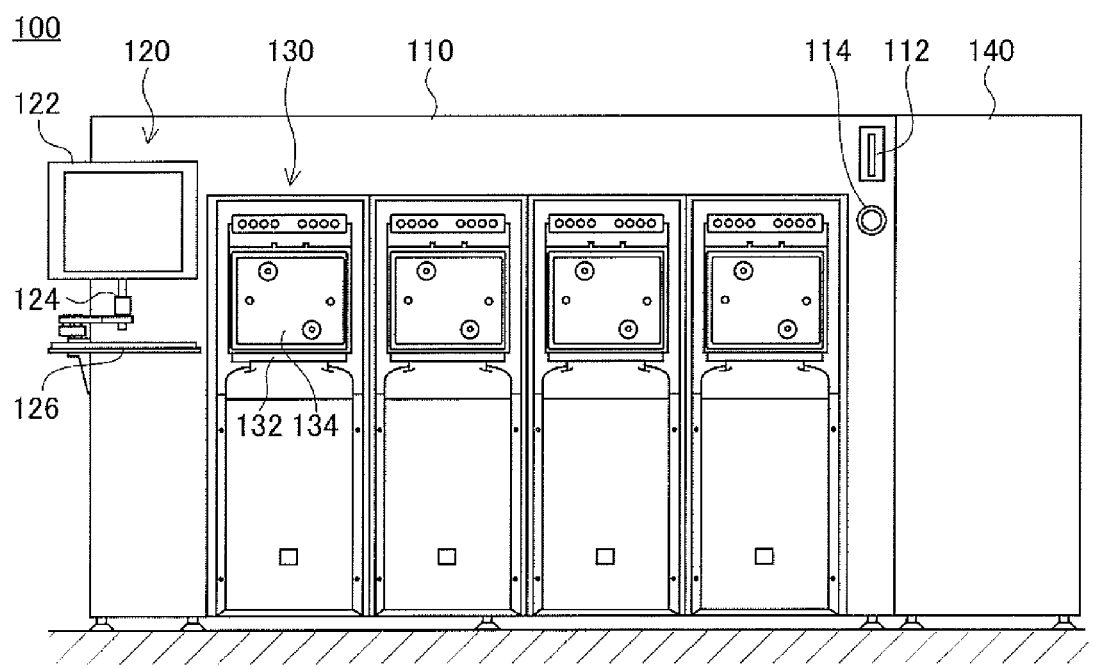
FIG. 1 is a front view of a testing apparatus 100.

FIG. 1 is a front view of an entire testing apparatus 100. The testing apparatus 100 includes a EFEM 110, an operation section 120, a load unit 130, and a tiller 140.

The EFEM 110 includes therein a mechanism for transporting a substrate to be tested inside the testing apparatus 100. Because the EFEM 110 has the largest size in the testing apparatus 100, a signal lamp 112 and an EMO 114 are provided in a higher place of the forehead of the EFEM 110, the signal lamp 112 showing the operational state of the testing apparatus 100, and the EMO 114 operating for stopping the testing apparatus 100 in case of emergency.

The operation section 120 is also supported by the EFEM 110. The operation section 120 includes a display 122, an arm 124, and an input apparatus 126. The arm 124 is coupled to the EFEM 110 at one end, and supports the display 122 and the input apparatus 126 to be freely movable at the other end.

The display 122 includes a liquid display apparatus or the like for example, and displays the operational state of the testing apparatus 100, echo back of the contents inputted by the input apparatus 126, and so on. The input apparatus 126 can include a keyboard, a mouse, a track ball, a jog dial or the like, to receive setting, operation, or the like of the testing apparatus 100.

The load unit 130 includes a load table 132 and a load gate 134. A container containing therein a semiconductor wafer to be tested is mounted to the load table 132. The load gate 134 opens and closes to transport in and out the semiconductor wafer to and from the testing apparatus 100. Accordingly, the semiconductor wafer can be loaded in from outside, without degrading the level of cleanliness inside the testing apparatus 100.

Prior to transporting it out, the tiller 140 cools the wafer whose temperature has been raised due to testing performed by the testing apparatus 100. To pursue this operation, the tiller 140 is provided between the load unit 130 involved in transporting out the semiconductor wafer, and the test head which executes the testing. The EFEM 110 is provided adjacent to the tiller 140, because the EFEM 110 also functions to transport in and out the semiconductor wafer to and from the tiller 140.

Figure 2:
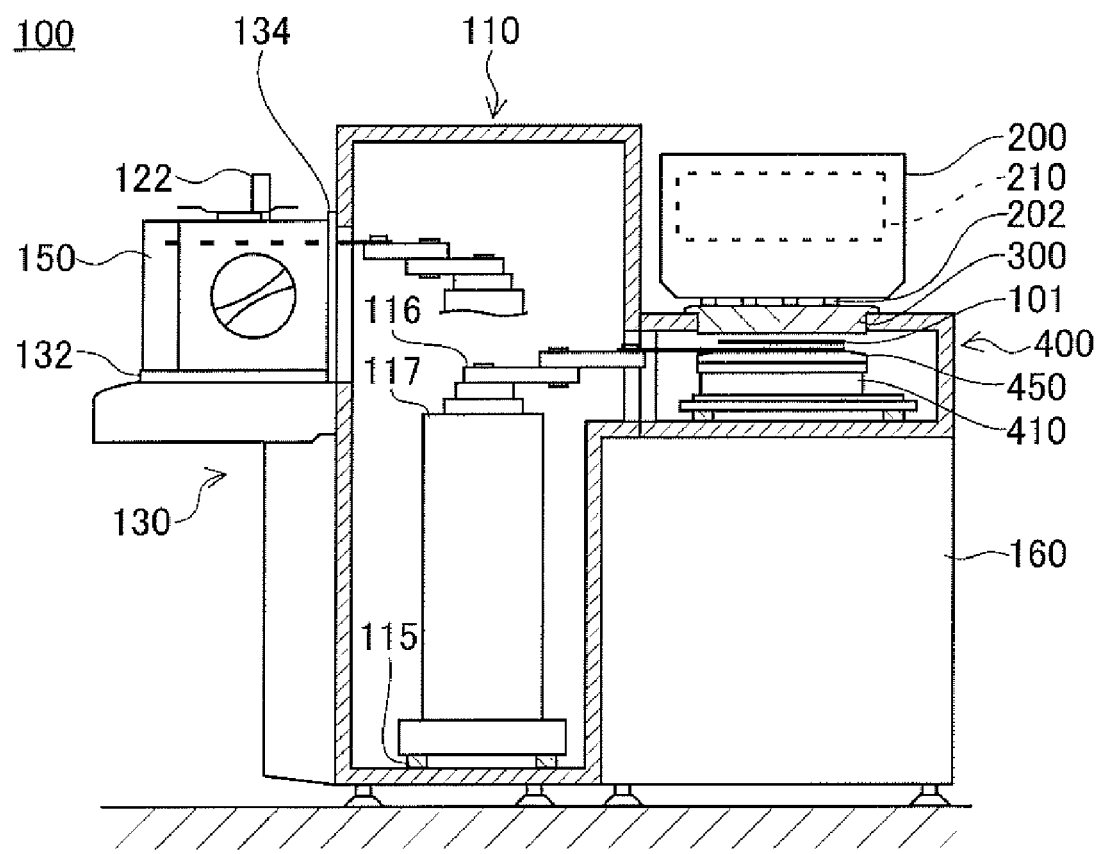
FIG. 2 is a partial longitudinal sectional view of the testing apparatus 100.

FIG. 2 is a partial longitudinal sectional view of the testing apparatus 100. The elements common to FIG. 1 are assigned the same reference numerals and not explained below. The testing apparatus 100 includes a load unit 130, an EFEM 110, a main frame 160, an alignment unit 400, a probe card 300, and a test head 200. Note that the tiller 140 is not shown in this drawing.

In this testing apparatus 100, the load unit 130, the EFEM 110, and the main frame 160 are aligned sequentially from the front (the left side in the drawing) to the backward (the right side in the drawing) to be adjacent to each other. The alignment unit 400, the probe card 300, and the test head 200 are stacked on the main frame 160.

A FOUP 150 is mounted on the load table 132 of the load unit 130. The FOUP 150 stores therein a plurality of wafers 101 to be tested. The FOUP 150 also accommodates the FOUP 150 therein when collecting wafers 101 finished being tested.

The EFEM 110 includes therein a robot arm 116. The robot arm 116 is mounted to the column 117 running along the rail 115, to transport a wafer between the load unit 130 and the alignment unit 400. For pursuing this operation, the load unit 130 and the EFEM 110, as well as the alignment unit 400 and the EFEM 110 respectively communicate to each other inside, to maintain high level of cleanliness inside.

The main frame 160 controls the operation of the entire testing apparatus 100. For example, the main frame 160 is connected to the operation section 120, to receive an input from the input apparatus 126 and cause each unit of the testing apparatus 100 to reflect the input. Moreover, the main frame 160 generates the display contents having reflected the operational state of the testing apparatus 100, and causes the display 122 to display the generated contents.

The main frame 160 further synchronizes the operation of the load unit 130, the EFEM 110, and the alignment unit 400, to mutually exchange a wafer 101. When the EMO 114 is operated, the operation of each unit of the testing apparatus 100 is immediately stopped. These operations are required regardless of the type of the wafer 101 to be tested or the contents of the test. In view of this, the main frame 160 is eternally included in the testing apparatus 100.

The alignment unit 400 includes an alignment stage 410. In other words, by exchanging the probe card 300, the testing apparatus 100 can be compatible to various types of wafers 101 different in layout from each other.

The alignment stage 410, to which a wafer tray 450 and the wafer 101 are mounted, runs along the rail 402. Moreover, the alignment stage 410 elongates and shrinks in the vertical direction, to raise and lower the mounted wafer 101. Consequently, the wafer 101 is pressed against the probe card 300 positioned above, after alignment of the wafer 101 with respect to the probe card 300.

When the testing apparatus 100 executes a test, the probe card 300 is positioned between the test head 200 and the wafer 101 and used as a circuit board unit for electrically connecting the test head 200 and the wafer 101. When executing a test to the wafer 101, the probe card 300 forms an electric signal path between the test head 200 and the wafer 101.

The test head 200 stores therein a plurality of pin electronics 210. The pin electronics 210 implements an electric circuit required according to the test target and the test contents. The test head 200 is electrically connected to the probe card 300 via the contactor 202 mounted at the lower surface of the test head 200.

In the testing apparatus 100 explained above, the wafer 101 to be tested is mounted to the load table 132, as included in the FOUP 150. The robot arm 116 takes out the wafers 101 one by one using the load gate 134, and transport the wafers 101 to the alignment unit 400.

In the alignment unit 400, the wafer 101 is mounted to the wafer tray 450 on the alignment stage 410. The alignment stage 410 aligns the mounted wafer 101 with respect to the probe card 300, and presses the aligned wafer 101 to the probe card 300 from below. The operations thereafter are detailed later.

Figure 3:
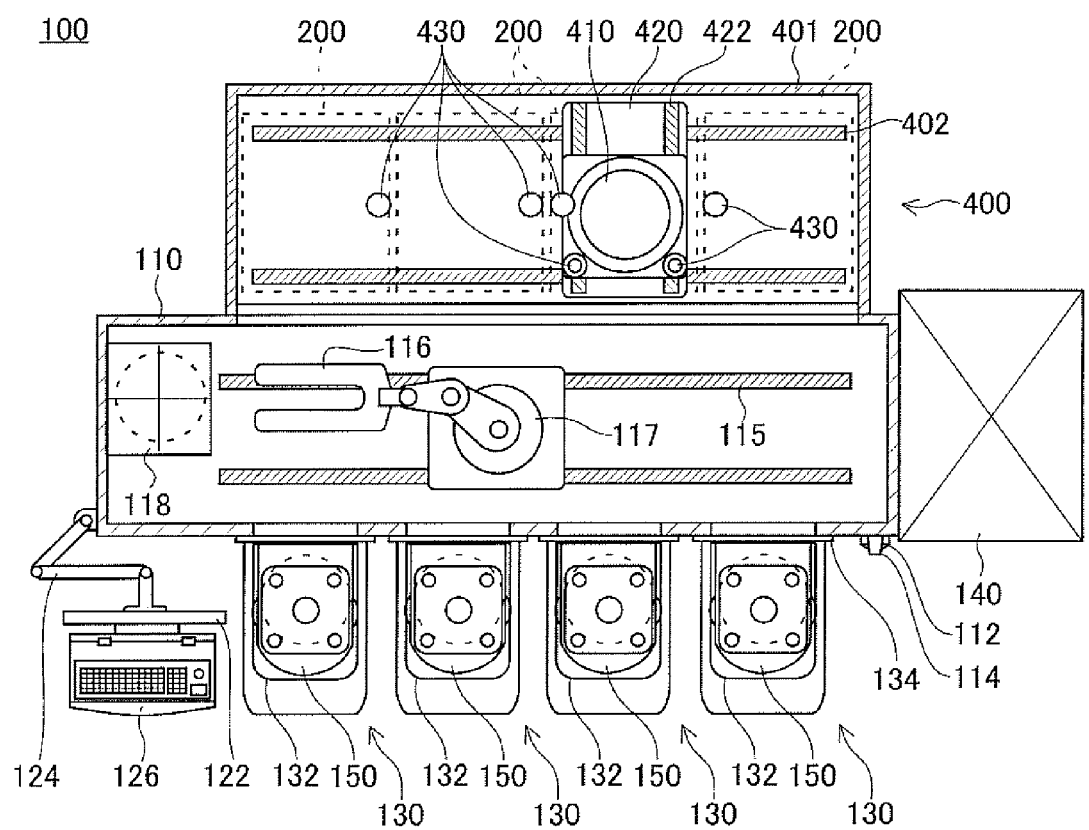
FIG. 3 is a partial horizontal sectional view of the testing apparatus 100.

FIG. 3 is a partial horizontal sectional view of the testing apparatus 100. The elements common to FIG. 1 and FIG. 2 are assigned the same reference numerals and not explained below. The testing apparatus 100 includes four load units 130 and four test heads 200. Each of the load units 130 is provided with a FOUP 150.

One EFEM 110 and one alignment unit 400 are provided. The alignment unit 400 includes a single alignment stage 410.

The column 117 supporting the robot arm 116 in the EFEM 110 moves across substantially the entire width of the EFEM 110 along the rail 115. As a result, the robot arm 116 can transport the wafer 101 to all the four load units 130 as well as to all the four test heads.

A pre-aligner 118 is provided at the end opposite to the tiller 140 within the EFEM 110. The pre-aligner 118 adjusts the mounting position of the wafer 101 relative to the robot arm 116 at a substantially high accuracy which may be lower than the accuracy required by the test head 200.

Accordingly, the accuracy for the initial position of the wafer 101 to be mounted to the wafer tray 450 by the robot arm 116 improves. Moreover, the time required for alignment with respect to the probe card 300 reduces. Moreover, the throughput of the testing apparatus 100 improves.

The alignment unit 400 includes rails 402, 422, a stage carrier 420, an alignment stage 410, and a microscope 430. The rail 402 is provided across substantially the entire width of the bottom surface of the casing 401. The stage carrier 420 moves in the lengthwise direction of the casing 401 along the rail 402.

The stage carrier 420 includes, at an upper surface thereof, a rail 422 orthogonal to the rail 402 of the casing 401. The alignment stage 410 moves in the widthwise direction of the casing 401 on the rail 422.

A part of a microscope 430 corresponds to each of the test heads 200, and is provided in the immediate vicinity of each of the probe cards 300. These microscopes 430 are provided at the ceiling of the casing 401 to be oriented downward.

Moreover a pair of microscopes 430 are mounted to the stage carrier 420 together with the alignment stage 410. This pair of microscopes 430 moves together with the alignment stage 410. These microscopes 430 are oriented upward.

By using these microscopes 430, the wafer 101 on the alignment stage 410 can be aligned relative to the probe card 300. That is, as mounted on the alignment stage 410, the wafer 101 is aligned with the pre-alignment accuracy. The position of the wafer 101 can be detected with accuracy by detecting the edge, for example, of the wafer 101 using the microscope 430 oriented downward.

Meanwhile, the relative position with respect to the probe card 300 of the microscope provided in the casing 401 is known. Accordingly, the difference between the position of the wafer 101 and the position of the probe card 300 can be detected, thereby moving the alignment stage 410 to compensate for the difference, to align the wafer 101 to the probe card 300.

Note that the detection of the wafer 101 can be performed based on other methods than using the edge thereof. For example, alignment may be performed manually by displaying an image of the microscope 430 on the display 122.

Figure 4:
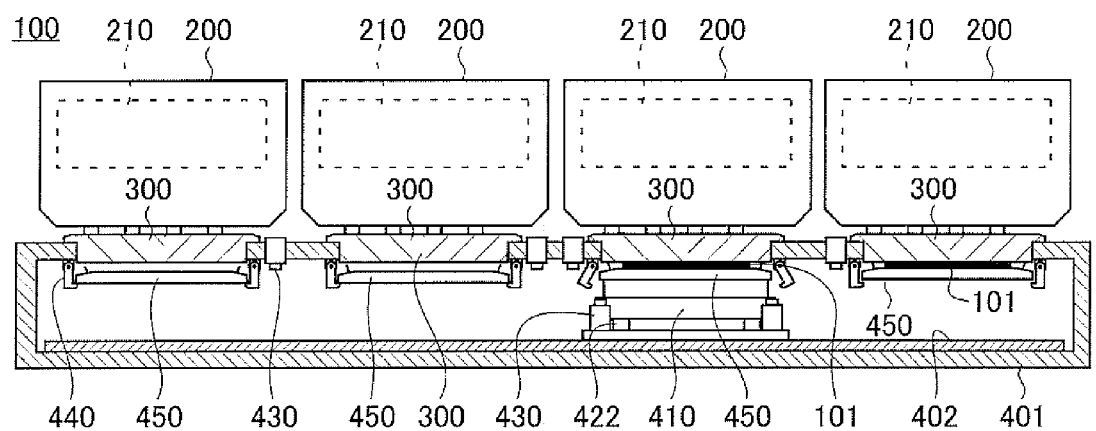
FIG. 4 is a partial longitudinal sectional view of an alignment unit 400.

FIG. 4 is a partial longitudinal sectional view of the structure of an alignment unit 400. The elements common to FIG. 1 through FIG. 3 are assigned the same reference numerals and not explained below. The alignment unit 400 includes a casing 401, an alignment stage 410, and a hanger hook 440.

The casing 401 has a width corresponding to a plurality of test heads 200, e.g., four test heads 200. On the upper surface of the casing 401, four probe cards 300 are mounted to respectively correspond to the test heads 200. Furthermore, the ceiling inside the casing 401 is provided with hanger hooks 440 that open and close, in positions respectively corresponding to the test heads 200.

A hanger hook 440 hangs the wafer tray 450 by closing, to hold it immediately below the probe card 300. The hanger hook 440 opens to release the wafer tray 450. Accordingly, the alignment unit 400 can hold a wafer tray 450 in a waiting state, immediately below each set of the test heads 200 and the probe cards 300.

The alignment stage 410 can move underneath of any of the test heads 200 along the rail 402 provided at the bottom surface of the casing 401. In addition, the alignment stage 410 can elongate and shrink in the vertical direction, to raise and lower the wafer tray 450 mounted thereon.

In the alignment unit 400 having the above-described structure, the wafer tray 450 held by the hanger hook 440 is temporary mounted to the alignment stage 410 independently from the others, by rising movement of the alignment stage 410 from below. Next, as the wafer tray 450 is released from the hanger hook 440 by opening it, the alignment stage 410 is lowered to release the wafer tray 450 from the hanger hook 440.

Then, the robot arm 116 of the EFEM 110 is used to mount the wafer 101 to the wafer tray 450 whose upper surface is released by lowering of the alignment stage 410. In this way, the alignment stage 410 can carry the wafer 101 as mounted on the wafer tray 450.

Next, the alignment stage 410 raises the wafer tray 450 to press it to the lower surface of the probe card 300, while keeping the alignment between the wafer 101 and the probe card 300. The probe card 300 adsorbs the pressed wafer tray 450 and the wafer 101. The structure of the probe card 300 for adsorbing the wafer 101 and the wafer tray 450 is detailed later.

The alignment stage 410 moves leaving behind the wafer 101 and the wafer tray 450, to carry the other wafers 101. In this way, the wafer 101 can be mounted to the test head 200.

When collecting the wafer 101 having finished being tested, the order of the series of explained operations can be reversed. Accordingly, the robot arm 116 can transport out the wafer 101, and the wafer tray 450 waits immediately below the test head 200.

In the illustrated example, the wafer tray 450 and the wafer 101 are adsorbed by the probe card 300 immediately below the test head 200 positioned on the right on the drawing. The hanger hook 440 is closed, but without in contact with the wafer tray 450.

Immediately below the second test head 200 from the right, the alignment stage 410 presses from below the wafer tray 450 and the wafer 101 mounted thereon, to be in close contact with the lower surface of the probe card 300. Below the other test heads 200, the corresponding hanger hook 440 holds the wafer tray 450 and is in the wait state.

In this way, the wafer trays 450 are mounted to respectively correspond to the four test heads 200 in the alignment unit 400. Accordingly, each of the test heads 200 can independently test a wafer 101.

Note that the plurality of test heads 200 may execute the same types of tests as each other, or execute different types of tests from each other. In the latter case, the throughput of the testing apparatus 100 can improve by controlling each of the plurality of test heads to share the load of a time-consuming test.

In this way, the testing apparatus 100 uses a single alignment stage 410 as well as a single robot arm 116, to a plurality of test heads 200. This improves a usage efficiency of the alignment stages 410 and the robot arms 116 unnecessary during executing of a test.

Figure 5:
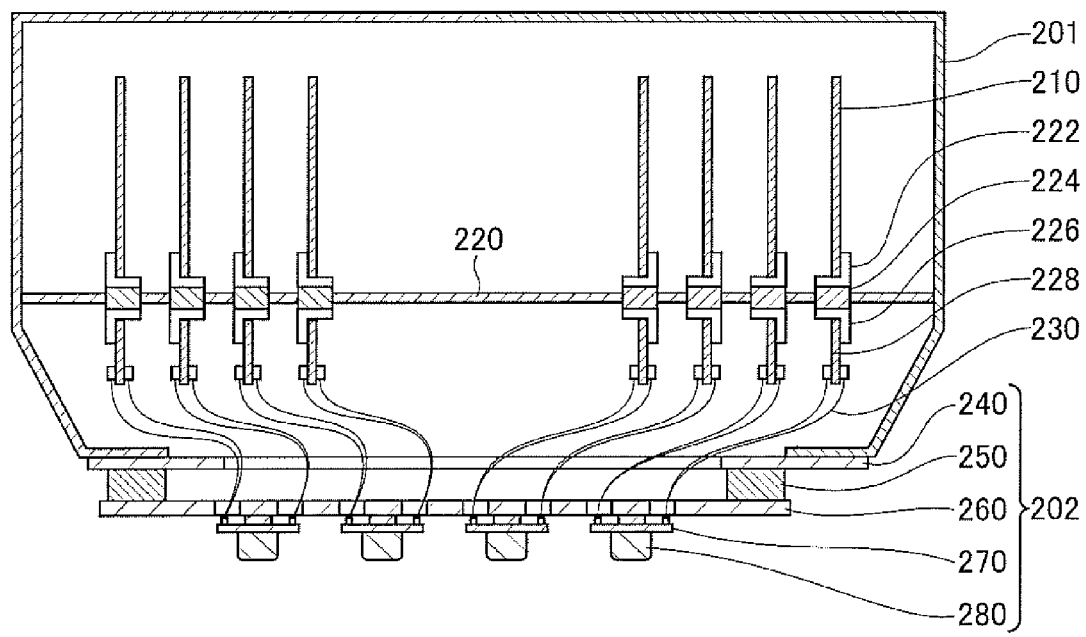
FIG. 5 is a sectional view of a test head 200.

FIG. 5 is a sectional view of a test head 200. The elements common to FIG. 1 through FIG. 4 are assigned the same reference numerals and not explained below. The test head 200 includes a casing 201, a contactor 202, a pin electronics 210, a motherboard 220, and a flat cable 230.

Inside the casing 201, the motherboard 220 including a plurality of relay connectors 224 are placed horizontally. Each of the relay connectors 224 includes receptacles respectively in the upper surface and the lower surface of the motherboard 220 to form a signal path penetrating the motherboard 220.

On the upper surface of the motherboard 220, each of the relay connectors 224 is provided with the pin electronics 210 via an angle connector 222. With such a configuration, the pin electronics 210 can be exchanged according to the specification of the test target and the test contents.

The plurality of pin electronics 210 may have the same specification as each other, or different specifications from each other. Moreover, a part of relay connectors 224 may not be provided with any pin electronics 210.

On the lower surface of the motherboard 220, each of the relay connectors 224 is connected to a small substrate 228 via an angle connector 226. An end of a flat cable 230 is connected to the small substrate 228. Accordingly, the later-detailed contactor 202 and the pin electronics 210 within the casing 201 can be connected to each other via the flat cable 230.

A contactor 202 is provided on the lower surface of the casing 201. The contactor 202 includes a support substrate 240, a three-dimensional actuator 250, a contactor substrate 260, a sub-substrate 270 and a contactor housing 280.

The support substrate 240 is fixed to the casing 201 at the upper surface, as well as supports the upper end of the three-dimensional actuator 250 at the lower surface. The lower end of the three-dimensional actuator 250 supports the contactor substrate 260. Furthermore, the sub-substrate 270 and the contactor housing 280 are fixed to the lower surface of the contactor substrate 260.

The three-dimensional actuator 250 can move in the horizontal direction along the lower surface of the support substrate 240, as well as elongate and shrink in the vertical direction. Accordingly, the contactor substrate 260 can be moved three-dimensionally. When the contactor substrate 260 has been moved, the sub-substrate 270 and the contactor housing 280 also move.

Note that the lower end of the flat cable 230 is coupled to the terminal, e.g., spring pin, held by the contactor housing 280. Accordingly, the pin electronics 210 can be electrically connected up to the lowest surface of the test head 200. Although the present example uses a spring pin, the present invention may include a structure of including connection not using any spring pin (e.g., capacity coupling or an optical link).

Figure 6:
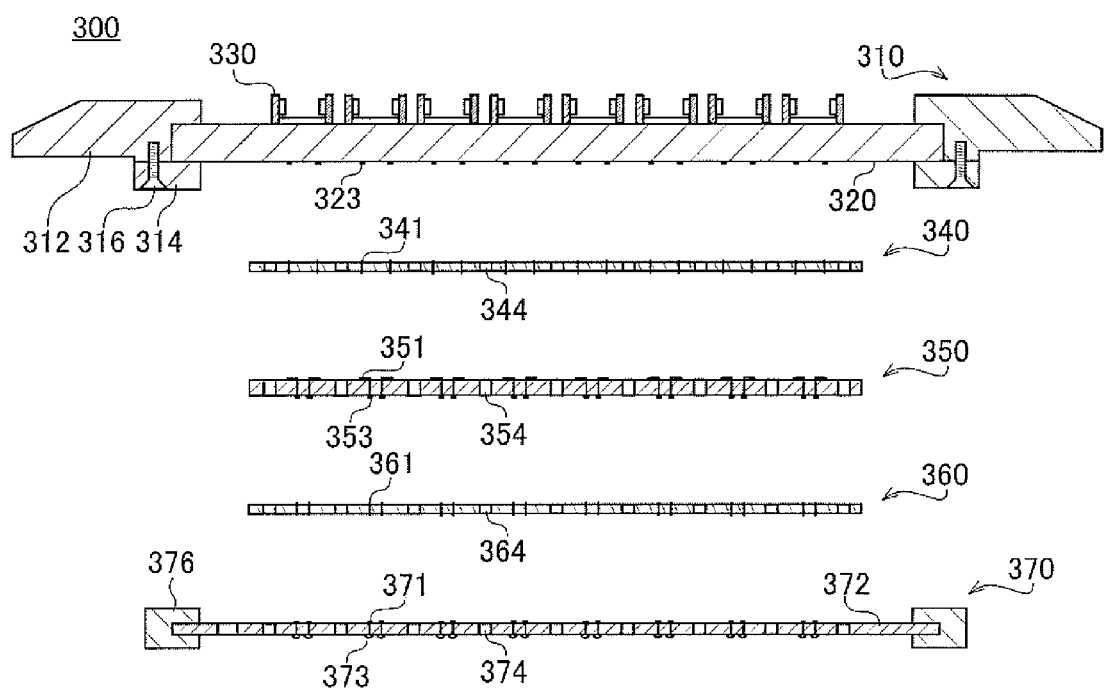
FIG. 6 is an exploded view of a probe card 300.

FIG. 6 is an exploded view of a probe card 300. The probe card 300 includes a circuit board 320, PCR sheets 340, 360, an interposer 350, and a membrane unit 370.

The circuit board 320 is made of an insulation substrate having relatively high mechanical strength, e.g., a polyimide plate. The periphery of the circuit board 320 is sandwiched between the upper frame 312 and the lower frame 314 (respectively in a frame shape) stacked to one another and fixed via a screw 316. This arrangement further improves the mechanical strength of the circuit board 320.

The circuit board 320 also includes a plurality of guide units 330 on its upper surface. A guide unit 330 functions as a connector guide for aligning the contactor 202 by guiding it, when the contactor 202 abuts on the circuit board 320.

On the lower surface of the circuit board 320, a plurality of contact pads 323 are provided to provide electric connection by contact. The contact pad 323, on the upper surface of the circuit board 320, is electrically connected to the contact pad not shown in the drawing provided inside the guide unit 330.

A PCR sheet 340 includes a through electrode 341 penetrating through the upper surface to the lower surface. The through electrode 341 of the PCR sheet 340 has the same layout as that of the contact pad 323 on the lower surface of the circuit board 320. Accordingly, when the circuit board 320 is stacked to be in close contact with the PCR sheet 340, the contact pad 323 is electrically connected to the through electrode 341.

The interposer 350 has contact pads 351 and 353 respectively on its upper surface and lower surface. The contact pad 351 at the upper surface has the same layout as that of the through electrode 341 of the PCR sheet 340. Accordingly, when the PCR sheet 340 is stacked to be in close contact with the interposer 350, the through electrode 341 is electrically connected to the contact pad 351.

The contact pads 353 on the lower surface of the interposer 350 have a layout different from the layout of the contact pads 351 on the upper surface. Accordingly, the contact pads 351 and 353 respectively on the front and rear surfaces of the interposer 350 have different pitches from each other. Note that a contact pad 353 on the lower surface has a corresponding contact pad 351 on the upper surface, and the corresponding contact pad 351 and contact pad 353 are electrically connected to each other.

The PCR sheet 360 has a through electrode 361 penetrating from the front surface to the rear surface. The through electrode 361 of the PCR sheet 360 has the same layout as that of the contact pad 353 at the lower surface of the interposer 350. Accordingly, when the PCR sheet 360 is stacked to be in close contact with the interposer 350, the through electrode 361 is electrically connected to the contact pad 353.

The membrane unit 370 includes an elastic sheet 372, a contact pad 371, a bump 373, and a frame 376. The elastic sheet 372 is made of an insulation material having elasticity.

The contact pad 371 has the same layout as that of the through electrode 361 on the lower surface of the PCR sheet 360, and is provided on the upper surface of the elastic sheet 372. Accordingly, when the PCR sheet 340 is stacked to be in close contact with the membrane unit 370, the through electrode 361 is electrically connected to the contact pad 371.

The bump 373 is provided on the lower surface of the elastic sheet 372. The frame 376 grasps the periphery of the elastic sheet 372, to maintain the elastic sheet 372 in a flat state.

Each of the PCR sheet 340, 360, the interposer 350, and the membrane unit 370 includes through holes 344, 354, 364, and 374 penetrating from front to rear surfaces. The through holes 344, 354, 364, and 374 are laid out in substantially the same position as each other. Accordingly, when the PCR sheets 340, 360, the interposer 350, and the membrane unit 370 are stacked to one another, the through holes 344, 354, 364, and 374 communicate to each other, to help exhaust air between these elements.

Figure 7:
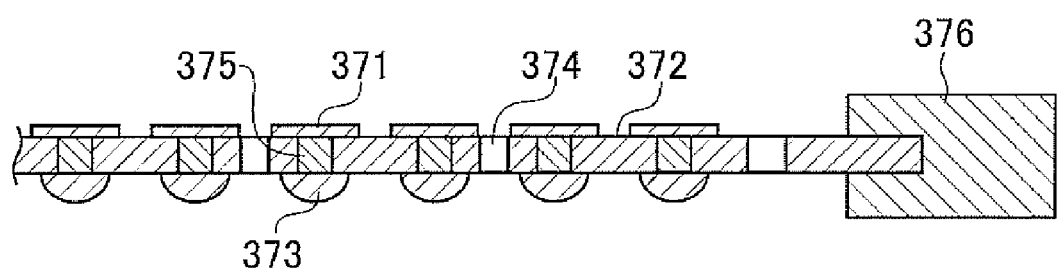
FIG. 7 is a partially enlarged sectional view of a membrane unit 370.

FIG. 7 is a partially enlarged sectional view of a membrane unit 370. In the membrane unit 370, the bump 373 is provided in a layout that is the same as the layout of the test pad of the circuit on the wafer 101 to be tested. The test pad, when executing a test of a device on the wafer 101, forms an electric contact used to input/output a signal and to supply power to the device under test.

The bump 373 forms a set of a plurality of bumps 373 corresponding to individual circuits on the wafer 101, and the number of bumps in the set is the same as the number of the circuits on the wafer 101. Furthermore, each of the bumps 373 has a center protruding downward. Therefore, the bumps 373 function as a contact terminal to the wafer 101 at the lowest surface of the probe card 300.

Each of the bumps 373 is electrically connected to any of the contact pads 371 via the through hole 375 buried in the elastic sheet 372. As explained above, a contact pad 371 has the same layout as that of the through electrode 361 of the PCR sheet 360 and that of the contact pad 353 on the lower surface of the interposer 350. Accordingly, when the membrane unit 370, the PCR sheet 360, and the interposer 350 are stacked to one another, electrical connection is provided from the bump 373 through the interposer 350.

Figure 8:
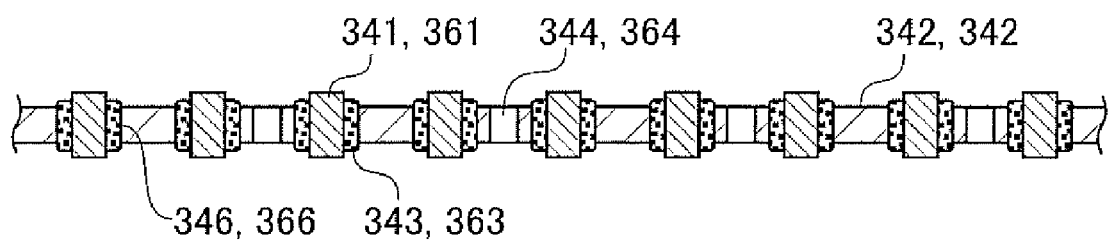
FIG. 8 is a partially enlarged sectional view of PCR sheets 340 and 360.

FIG. 8 is a partially enlarged sectional view of PCR sheets 340 and 360. The PCR sheet 340 and 360 include through electrodes 341, 361, frames 342, 362, and elastic supports 343 and 363.

The frames 342 and 362 are formed by a material such as metal having high rigidity, and have a plurality of thorough holes 346 and 366 having an inner diameter larger than the outer diameter of the through electrodes 341 and 361. Each of the through electrodes 341 and 361 is supported by the frame 362 via the elastic supports 343 and 363, inside the through holes 346 and 366 formed on the frames 342 and 362.

The elastic supports 343 and 363 are formed by a flexible material such as a silicon rubber. The length of the through electrodes 341 and 361 is larger than the thickness of the frame 362. Accordingly, when the PCR sheets 340 and 360 are sandwiched between the interposer 350 and the circuit board 320, or between the interposer 350 and the membrane unit 370, they will absorb convex/concave variations of each material, to provide favorable electric coupling.

Figure 9:
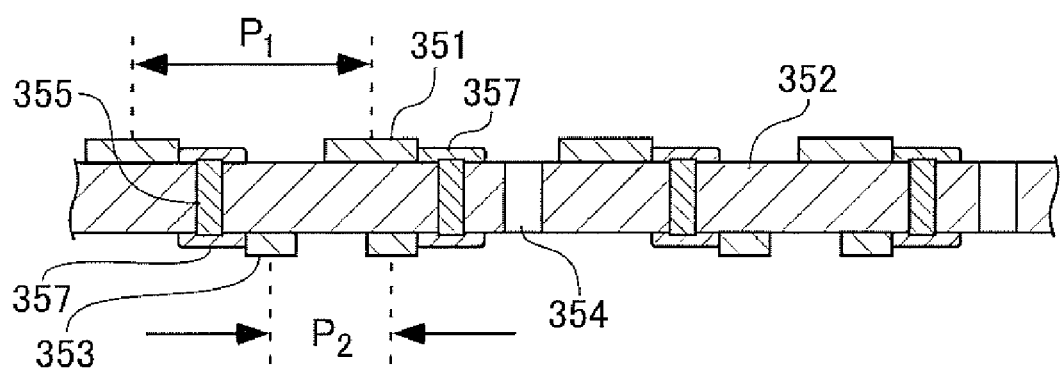
FIG. 9 is a partial sectional view of an interposer 350.

FIG. 9 is a partial sectional view of an interposer 350. The substrate 352 of the interposer 350 includes a plurality of through holes 355 penetrating from the front surface to the rear surface of the substrate 352. Each of the through holes 355 is connected to the contact pad 351 and 353 via the wiring layer 357. Accordingly, the contact pads 351 and 353 on the front and rear surfaces of the substrate 352 are electrically connected to each other.

Since the wiring layer 357 is positioned between the through hole 355 and the contact pads 351, 353, the contact pad 351 on the upper surface can have a layout different from that of the contact pad 353 on the lower surface. Accordingly, even when the contact pad 353 on the lower surface of the interposer 350 is caused to match a test pad of the wafer 101 to be tested, the contact pad 351 on the upper surface of the interposer 350 can be laid out arbitrarily.

Specifically, the test pads of the wafer 101 are built-in in an integrated circuit, and so the area of each test pad as well as the pitch therebetween is small. However, by matching the pitch P2 of the contact pads 353 on the lower surface of the interposer 350 to a test pad, and enlarging the pitch P1 of the contact pads 351 on the upper surface of the interposer 350, the pitch of the through electrodes 341 and the contact pads 323 can be enlarged in the PCR sheet 340 and the circuit board 320 stacked on the upper side of the interposer 350.

By causing the area of the contact pad 351 on the upper surface of the interposer 350 to be larger than the area of the contact pad 353 on the lower surface, the relative positional accuracy requirement for the interposer 350, the PCR sheet 340, and the circuit board 320 can be alleviated. Moreover, electric property attributed to the contact resistance or the like can improve.

In this way, the pitch of the contact pads 321 provided on the upper surface of the probe card 300 is wider than that of the bumps 373 of the membrane unit 370. In addition, the area of a contact pad 321 can be set larger than that of a bump 373. Accordingly, the connection can be made easy and assuredly between the contactor 202 and the probe card 300.

Figure 10:
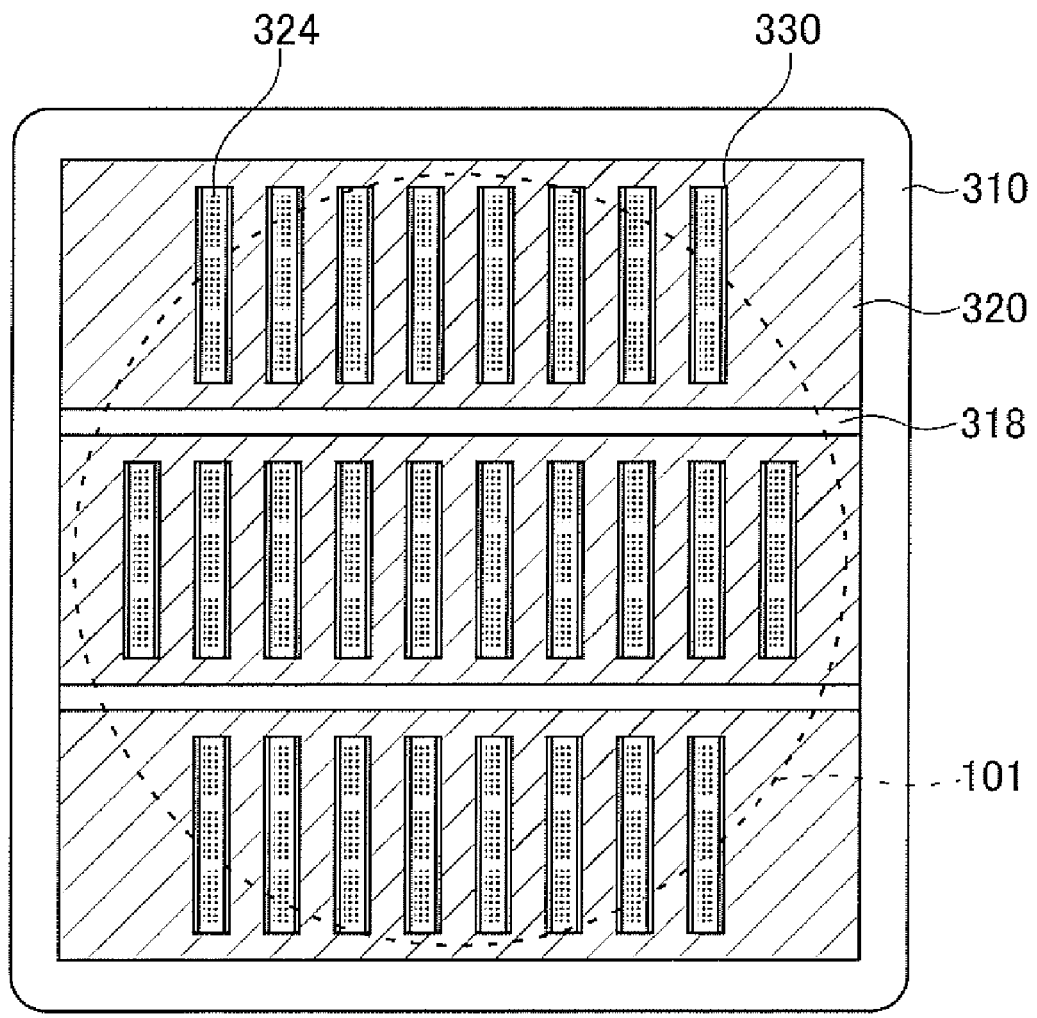
FIG. 10 is a plan view of a circuit board 320.

FIG. 10 is a plan view of a circuit board 320. The plan shape of the circuit board 320 is rectangular slightly larger than a rectangle circumscribing the wafer 101 represented by the dotted line. The stiffener 310 surrounds the circuit board 320. The stiffener 310 includes a crossing member 318 transversing the circuit board 320.

The crossing member 318 is attached with high rigidity with respect to the stiffener 310 in a frame formation. Accordingly, the bending rigidity as well as torsional rigidity for the entire circuit board 320 formed integrally with the stiffener 310 improve. This restricts deformation such as warping of the circuit board 320.

A plurality of guide units 330 are provided to be parallel to each other between the stiffener 310 and the crossing member 318, on the upper surface of the circuit board 320. In addition, in the inside of each of the guide units 330, pad groups 324 composed of a plurality of contact pads on the upper surface of the circuit board 320 are formed. In this way, the plurality of contact pads 321 of the probe card 300 may be formed by an "n" set of pad groups 324 including the same signal sequence as each other.

The pad groups 324 have the same alignment as each other. Each contact pad forming a pad group 324 is electrically connected to any of the contact pads 321 at the lower surface of the circuit board 320, however the pad groups 324 have the same signal sequence for contact pads.

A pad group 324 to be tested by a single connection by the contactor 202 may be aligned corresponding to the test pads sharing the same signal sequence in the wafer 101. Accordingly, the contactor 202 having the same specification as each other can be utilized to provide electric connection to a pad group 324. In addition, electric connection can be provided to a plurality of pad groups 324 by moving a single contactor 202.

The circuit board 320 has a configuration such that contact pads are provided in an area overlapping with the wafer 101, and occupies an area that is close to the area of the wafer 101. This facilitates manufacturing of a smaller sized probe card 300 including the circuit board 320, as well as contributing to a smaller space of the testing apparatus 100.

Figure 11:
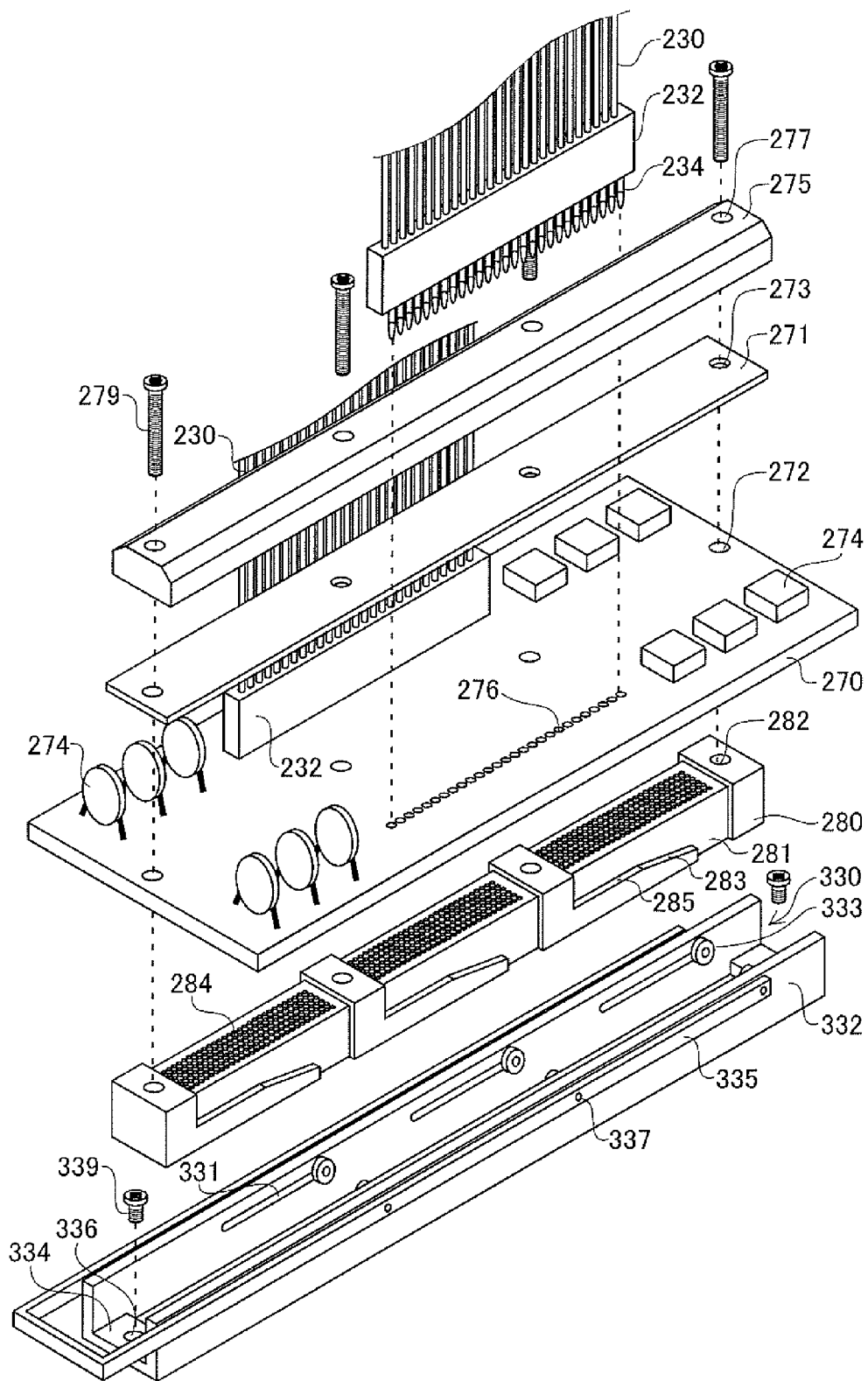
FIG. 11 is a partially exploded perspective view of a contactor 202.

FIG. 11 is a partially exploded perspective view of a contactor 202. The contactor 202 includes a sub-substrate 270 and a contactor housing 280. The sub-substrate 270 has a length substantially equal to the longitudinal size of the contactor housing 280, and a width larger than the width of the contactor housing 280.

In addition, the sub-substrate 270 includes a screw hole 272 penetrating itself in the thickness direction and a receptacle 276. The screw hole 272 is positioned in the same place as that of the screw hole 282 of the contactor housing 280 described later, and has an inner diameter that allows insertion of the screw 279.

The receptacle 276 has a shape complementing the shape of the contact pin 234 protruding downward from the connector housing 232. The connector housing 232 is mounted to the lower end of the flat cable 230, where each contact pin 234 is electrically connected to each wire of the flat cable 230.

The receptacle 276 is connected to the wiring of the sub-substrate 270 not shown in the drawings. Accordingly, when the contact pin 234 is inserted in the receptacle 276, the flat cable 230 and the wiring of the sub-substrate 270 are electrically connected to each other.

An insulation sheet 271, a reinforcing member 275, and mounting components 274 are provided on the upper surface of the sub-substrate 270. The insulation sheet 271 and the reinforcing member 275 respectively have substantially the same occupation area as that of the contact housing 280. Moreover, the insulation sheet 271 and the reinforcing member 275 have the same alignment as that of the screw hole 272 of the sub-substrate 270, and respectively include screw holes 273 and 277 penetrating in the thickness direction.

The insulation sheet 271 is made by a dielectric material, and is inserted between the sub-substrate 270 and the reinforcing member 275. Accordingly, even when circuitry is formed on the upper surface of the sub-substrate 270, electrically conductive metal can be used as the reinforcing member 275.

The mounting component 274 can be an electric device such as a bypass capacitor. By mounting this type of devices to the sub-substrate 270, noise can be restrained in the immediate vicinity of the wafer 101.

The contactor housing 280 has a plurality of housing holes 284 that are open on the upper surface, and steps formed on a side surface, each step including a slope portion 283 and a flat portion 285. The housing hole 284 penetrates the contactor housing 280 in the height direction. The flat portion 285 and the slope portion 283 are provided about in the middle of the height of the contactor housing 280, and a part of the lengthwise direction of which forms a passing portion 281 that is without any step.

The reinforcing member 275, the insulation sheet 271, and the contactor housing 280 are fixed by a screw 279 in the state sandwiching the sub-substrate 270 therebetween. Accordingly, the sub-substrate 270, the insulation sheet 271, and the reinforcing member 275 are integrated to each other, to realize high mechanical strength.

A guide unit 330 includes a channel member 332, a roller 333, an operation bar 335, and a spindle 337. The channel member 332 has such a shape that the both ends of a pair of vertical walls are connected by a pair of horizontal links 334. A screw hole 336 is provided in the center of the links 334.

An elongate hole 331 penetrates a vertical wall of the channel member 332, to be oriented in the lengthwise direction of the channel member 332. The roller 333 is supported by one end of the spindle 337 inserted to the elongate hole 331, and is provided in the channel member 332. The other end of the spindle 337 is linked by the operation bar 335.

Accordingly, when the operation bar 335 moves in the lengthwise direction of the channel member 332, the plurality of rollers 333 can be collectively moved. Note that the guide unit 330 is mounted on the upper surface of the circuit board 320 by means of the screw 339 inserted to the screw hole 336.

Figure 12:
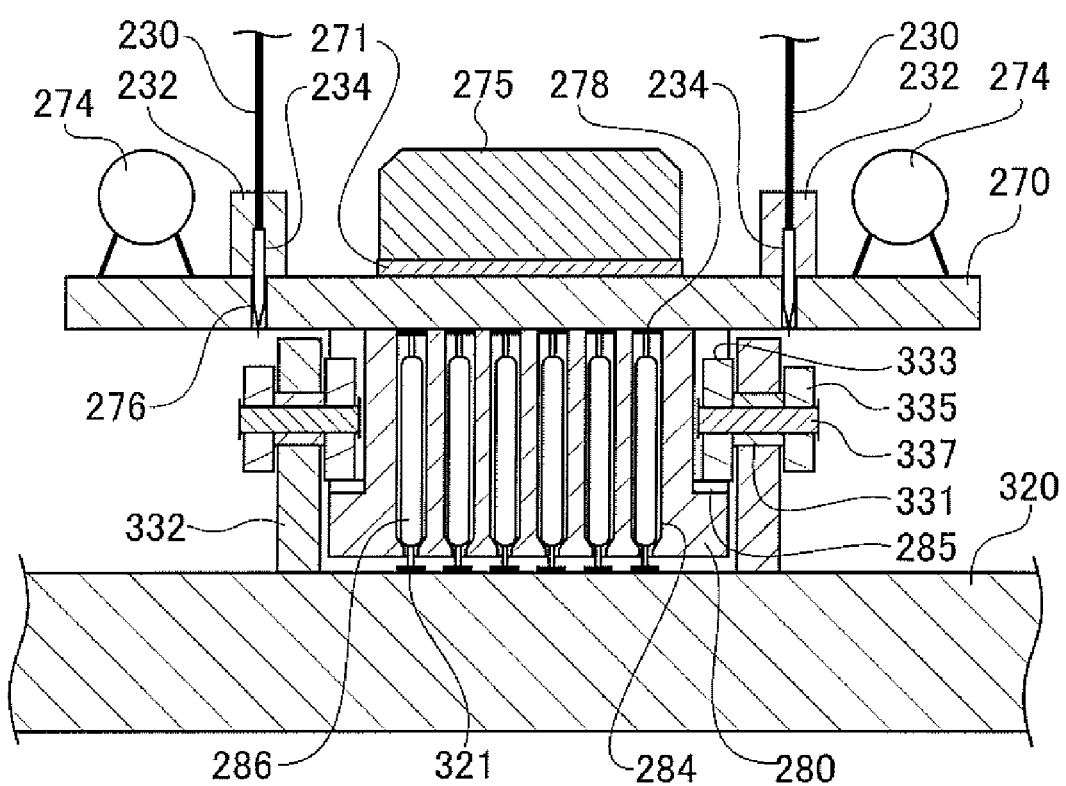
FIG. 12 is an enlarged sectional view of the contactor 202.

FIG. 12 is an enlarged sectional view of the contactor 202. The elements common to the other drawings are assigned the same reference numerals and not explained below.

The contactor housing 280 forms an example of a connector, in which each of the housing holes 284 is provided with a spring pin 286 therethrough. A spring pin 286 is biased at the both ends in the direction it elongates. Therefore, after the contactor housing 280 is mounted to the sub-substrate 270, the upper end of the spring pin 286 is pressed against the contact pad 278 at the lower surface of the sub-substrate 270, to be electrically connected to the wiring of the sub-substrate 270.

When the testing apparatus 100 executes a test, the contactor housing 280 will be totally included inside the guide unit 330. The interval of the rollers 333 of the guide unit 330, above the step, is substantially equal to the width of the contactor housing 280. Therefore, the roller 333 can be moved along the step by moving the operation bar 335 when the roller 333 having passed the passing portion 281 has reached the upper side of the step.

The roller 333 having passed the slope portion 283 from the passing portion 281 eventually runs on the flat portion 285. At this timing, the contactor housing 280 is pressed down towards the circuit board 320. Accordingly, the lower end of each spring pin 286 is pressed against the contact pad 321 on the upper surface of the circuit board 320. In this way, the signal path can be formed from the probe card 300 containing the circuit board 320 to the test head via the contactor 202 and the flat cable 230.

Note that the contactor housing 280 is pulled and pressed against the circuit board 320, in the unit of guide unit 330. Accordingly, even without a large pressure to the entire contactor 202, electric coupling can be assuredly provided. In addition, the contactor housing 280 is pulled to each guide unit 330, electrical connection can be provided without a large pressure to the entire probe card 300.

Furthermore, since the pressuring of the contactor housing 280 is performed by the guide unit 330, the test head 200 does not have to generate a large pressure for pressuring the entire contactor 202 to the probe card 300. Accordingly, the three-dimensional actuator 250 can exercise a driving force sufficient for moving the contactor 202 to the alignment position, which enables selection of a small-sized and less expensive specification.

Figure 13:
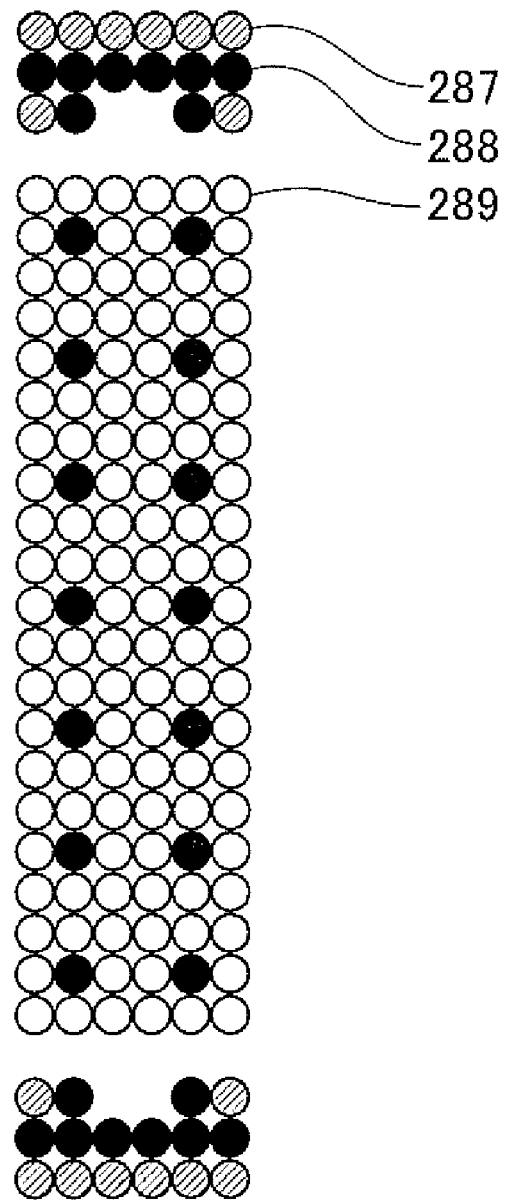
FIG. 13 shows a signal sequence in a contactor housing 280.

FIG. 13 shows a signal sequence for a spring pin 286 in a contactor housing 280. In a single contactor housing 280, three groups of housing holes 284 are provided. By equalizing the signal sequence of the spring pins 286 inserted to each of these groups, the contactor 202 having the same specification can be used to form electric connection for a pad group 324. Moreover, it is also possible to form electric connection to the plurality of pad groups 324 by moving a single contactor 202.

In the illustrated example, the spring pin 286 positioned at the end of the contactor housing 280 is assigned a power supply line 287, and the spring pin 286 positioned in about the middle of the contactor housing 280 is assigned a signal line 289, and a ground line 288 is assigned therebetween. According to such an alignment, the power supply line 287 can be shared, to reduce the number of spring pins 286. In addition, noise from the power supply line 287 to the signal line 289 is restrained.

Figure 14:
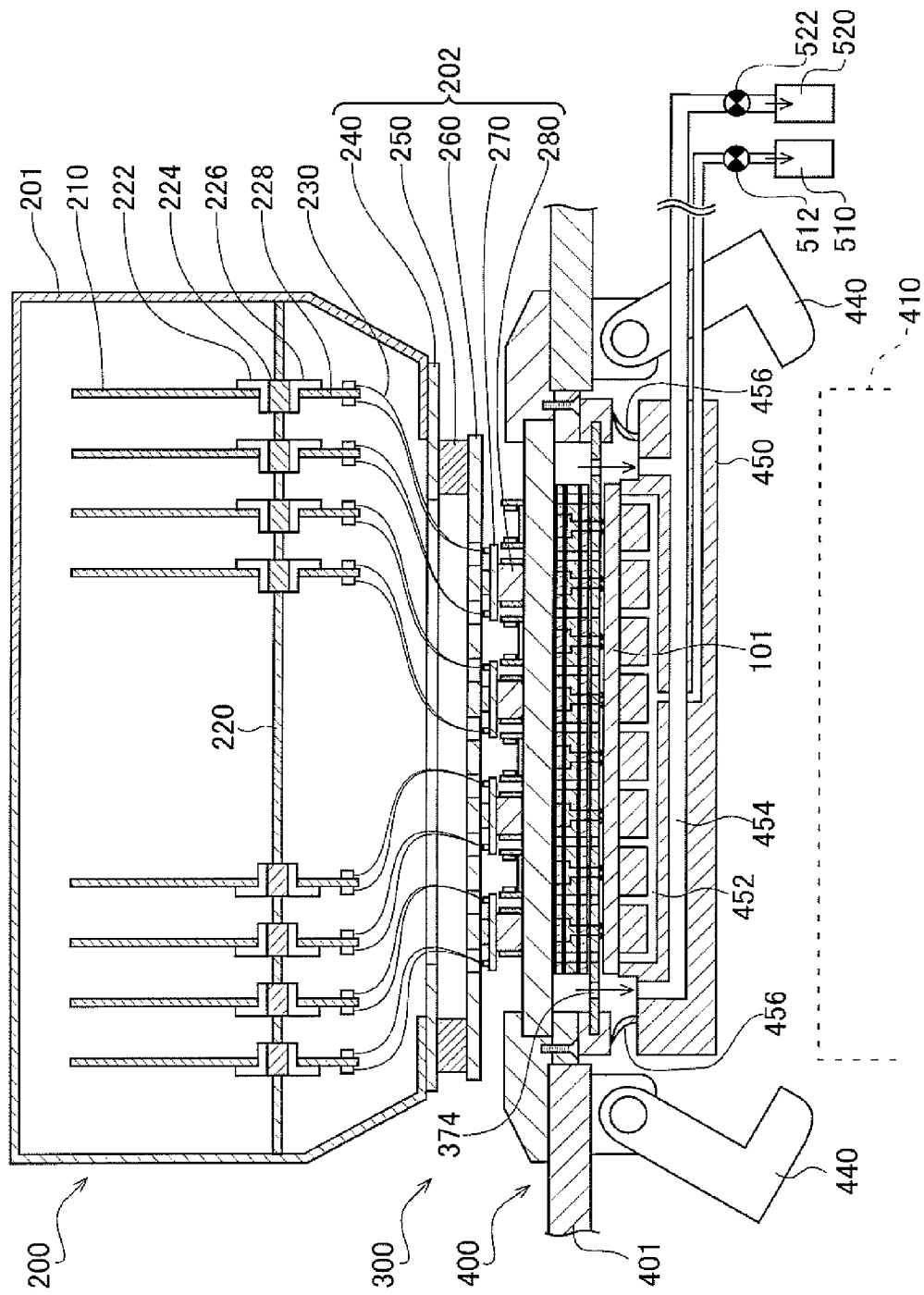
FIG. 14 is a sectional view of a test head 200 and a probe card 300.

FIG. 14 is a sectional view of a test head 200 and a probe card 300. The elements common to the other drawings are assigned the same reference numerals and not explained below.

The wafer tray 450 includes flow paths 452, 454, and a diaphragm 456. An end of the flow path 452 at the region mounting the wafer 101 on the upper surface of the wafer tray 450 is open. The other end of the flow path 452 is coupled to the low pressure source 510 via a valve 512. Accordingly, when the valve 512 is communicated, with the wafer 101 being mounted, the wafer tray 450 adsorbs the wafer 101 to hold it.

The flow path 454 of the wafer tray 450 is open to outside the region for mounting the wafer 101 on the upper surface of the wafer tray 450. The other end of the flow path 454 is coupled to the low pressure source 520 via the valve 522.

The diaphragm 456 is made of an elastic material, and is attached airtight to the periphery of the wafer tray 450 at further outside of the opening of the flow path 454. When the alignment stage 410 is raised to press the wafer 101 against the lower surface of the probe card 300, the upper end of the diaphragm 456 is also in contact with the lower surface of the probe card 300, to seal between the space between the wafer tray 450 and the probe card 300 airtight. Accordingly, when the valve 522 is communicated, with the wafer 101 being mounted, the wafer tray 450 is adsorbed to the lower surface of the probe card 300, to press the held wafer 101 against the probe card 300.

A through hole 374 is provided through an elastic sheet 372 of the membrane unit 370 positioned on the lowest surface of the probe card 300. Accordingly, when the pressure of the space between the probe card 300 and the wafer tray 450 is lowered, the inside of the probe card 300 is also subjected to a lower pressure. Accordingly, the circuit board 320, the PCR sheet 340, 360, the interposer 350, and the membrane unit 370 of the probe card 300 are pressed against each other, to assuredly form a signal path from the wafer 101 to the test head 200.

In this way, a testing apparatus 100 for testing a plurality of devices formed on a wafer 101 is provided where the testing apparatus comprising: a probe card 300 connected to a plurality of test pads on the lower surface of the probe card 300 overlapped to the wafer and provided with a plurality of corresponding contact pads 321 on the upper surface of the probe card 300; and contactor 202 for sequentially connecting to each part of the plurality of contact pads 321 of the probe card 300.

Figure 15:
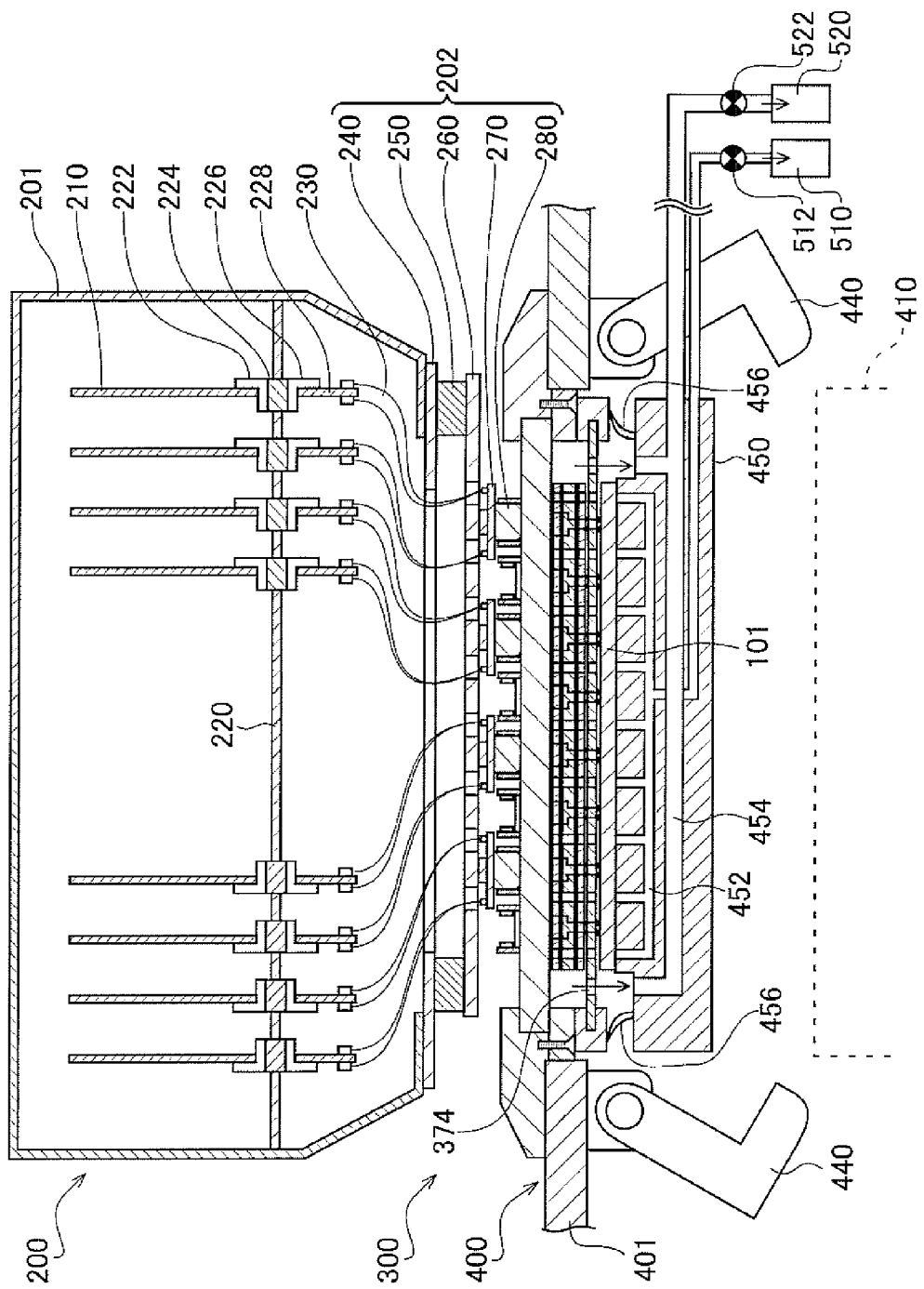
FIG. 15 is a sectional view of a test head 200 and a probe card 300.

FIG. 15 is a sectional view of a test head 200 and a probe card 300. This drawing is the similar to FIG. 14, except that the contactor substrate 260 and the contactor housing 280 of the contactor 202 move to be fitted to a guide unit 330 different from the case of FIG. 14. Therefore, the elements common to FIG. 14 are assigned the same reference numerals and not explained below.

The contactor housing 280 can be raised from the guide unit 330 by moving the operation bar 335 of the guide unit 330 up to the position of the passing portion 281 of the roller 333. By keeping this state, in the contactor 202, by operating the three-dimensional actuator 250, the contactor substrate 260, the sub-substrate 270, and the contactor housing 280 can be raised to be removed from the guide unit 330.

Furthermore, by operating the three-dimensional actuator 250, moving the contactor substrate 260, the sub-substrate 270, and the contactor housing 280 horizontally (to the right in the drawing), and lowering again in another position, the contactor housing 280 can be inserted to a guide unit 330 that was empty in the state of FIG. 14. Since the pulling mechanism by the roller 333 and the signal sequence for the contact pad 321 are the same within the other guide units 330, the same test can be executed in the other guide units 330 using the same test head 200.

Figure 16:
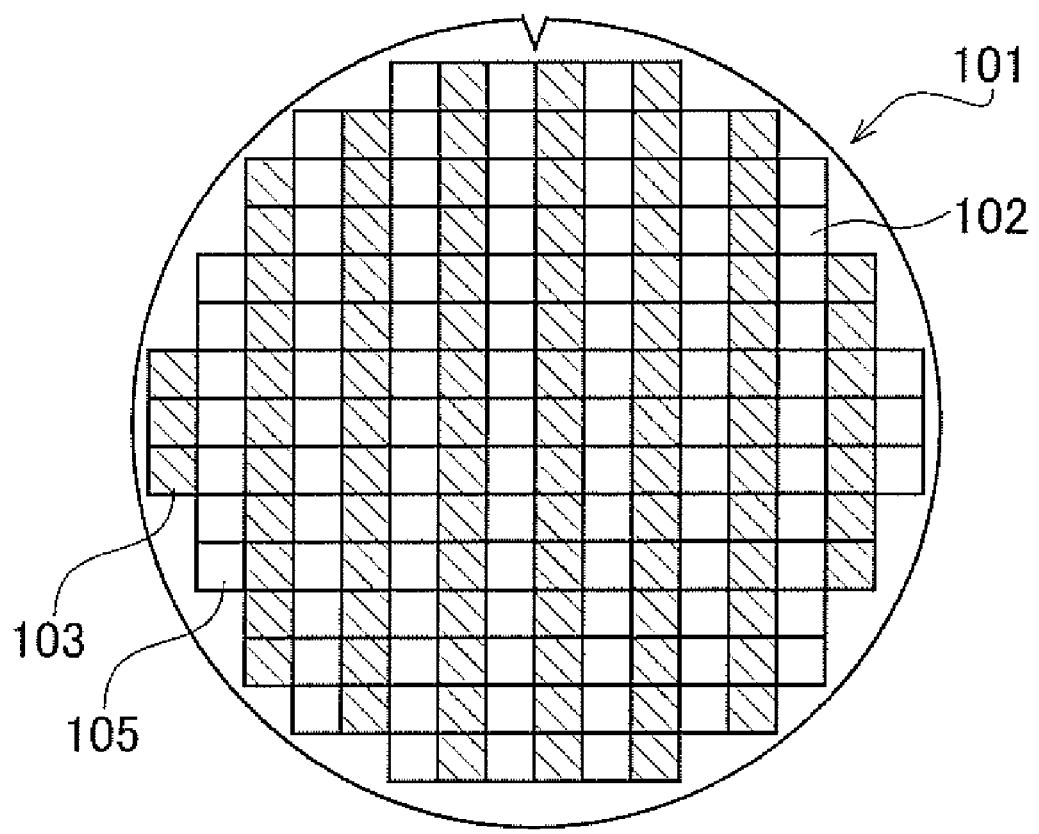
FIG. 16 is a plan view showing a test execution region 103.

FIG. 16 is a plan view showing regions to which a test is executed in the wafer 101. When the contactor 202 is connected to the probe card 300 as shown in FIG. 14, every other columns of device regions 102 from the most left column, in the plurality of device regions 102 of the wafer 101, are set to be a test execution region 103 to which a test is executed (see portions with diagonal lines in the drawing).

The other device regions 102 correspond to the guide units 330 not connected to a contactor 202, and form a test non-execution region 105 to which a test is not executed.

Figure 17:
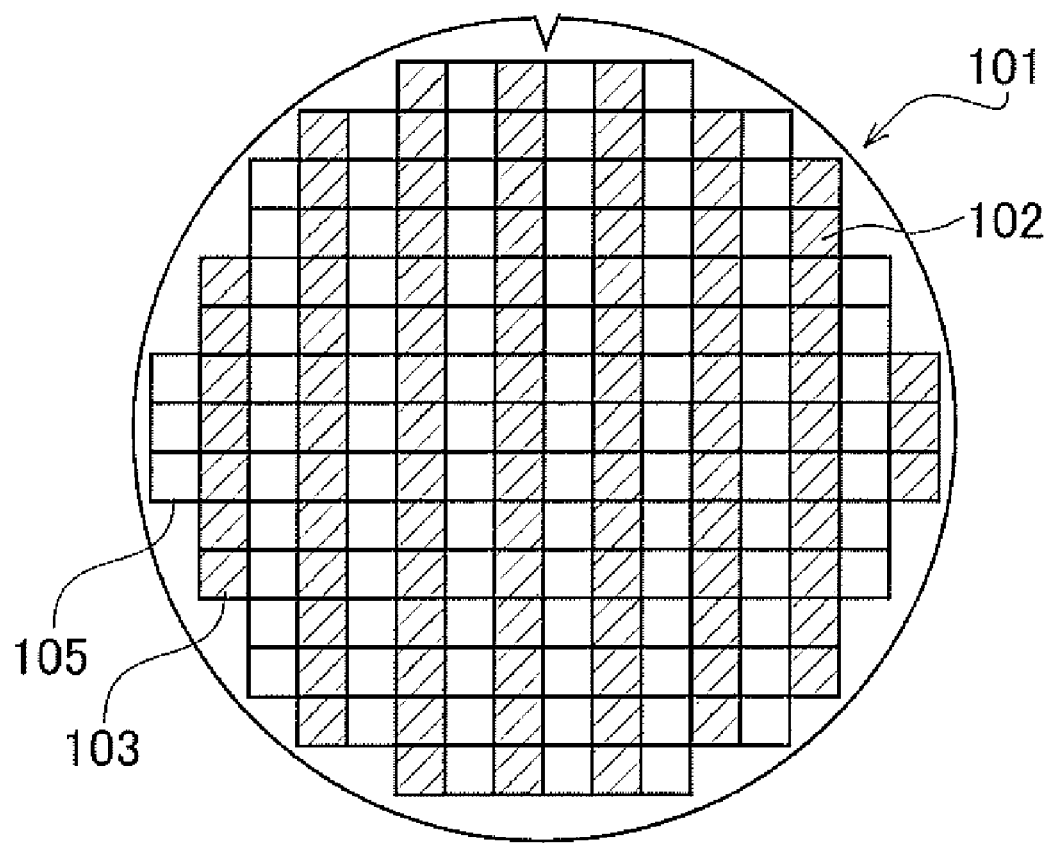
FIG. 17 is a plan view showing a test execution region 103.

FIG. 17 also shows regions to which a test is executed in the wafer 101. FIG. 17 is different in that it shows a case where the contactor 202 is displaced such that the contactor 202 and the probe card 300 are connected as shown in FIG. 15.

In this case, the device regions 102 that used to form a test execution region 103 in FIG. 16 form a test non-execution region 105, and the regions which used to form a test non-execution region 105 in FIG. 16 form a test execution region 103.

In this way, each of the pad groups 324 on the probe card 300 may be sequentially connected to the device regions 102 adjacent in the wafer 101. Accordingly, by moving the contactor 202, the entire wafer 101 can be tested by dividing it in two parts. In other words, the size of the test head 200 can be reduced to half, compared to the case where the entire wafer 101 should be tested at a time.

The contactor 202 has a structure to be abutting on and distanced with respect to the upper surface of the probe card 300 on which the pitch and the area of the contact pads 321 are both increased, and so has a tolerance in alignment accuracy of the contactor 202 compared to the structure of in which the contactor 202 is to directly abut on the wafer 101. Accordingly, the contact 202 can be quickly raised/lowered and moved, to improve the throughput of the testing apparatus 100.

Note that the number of parts in which the entire wafer 101 testing is divided is not limited to two. In fact, by sequentially connecting the contactor 202 including the plurality of spring pins 286 corresponding to the plurality of every "n" device regions 102 on the sequence of the wafer 101, the entire wafer 101 can be tested by dividing it into "n" parts. When the test for a single wafer 101 is divided into "n," the force required to press the contactor 202 to the probe card 300 becomes 1/n, which saves the strength as well as the power source of the testing apparatus 100.

Moreover, in addition to the tolerance of the strength of the probe card 300 and the like, a test can be executed without much burden such as to cause warping of the wafer 101. Furthermore, even by pressing the contactor 202 by such a small pressure, electric connection can be assured between the contactor 202 and the probe card 300.

The arrangement of the test execution region 103 and the test non-execution region 105 is not limited as explained in the drawings. Alternatively, the test execution region 103 can be formed to represent a checkered pattern, to evenly distribute the heat generated by the device regions 102 due to testing, across the wafer 101.

In this way, a single test can be divided into several parts by including a plurality of contactors 202 corresponding to part of a plurality of device regions 102 aligned on the wafer 101, to sequentially connect the wafer 101 via the probe card 300. By doing so, the number of electric contacts and the number of pin electronics which have high impact on the cost can be reduced, to reduce the size and the cost of the testing apparatus 100.

Note the above-described embodiment(s) has such a structure that the contactors 202 are moved relative to the fixed probe card 300, to connect the contactors 202 to different pad groups 324. However, the structure of the testing apparatus 100 is not limited to as such. In fact, a structure is also possible in which the contactors 202 are fixed, and the probe card 300, the wafer 101, and the wafer tray 450 are collectively moved.

Figure 18:
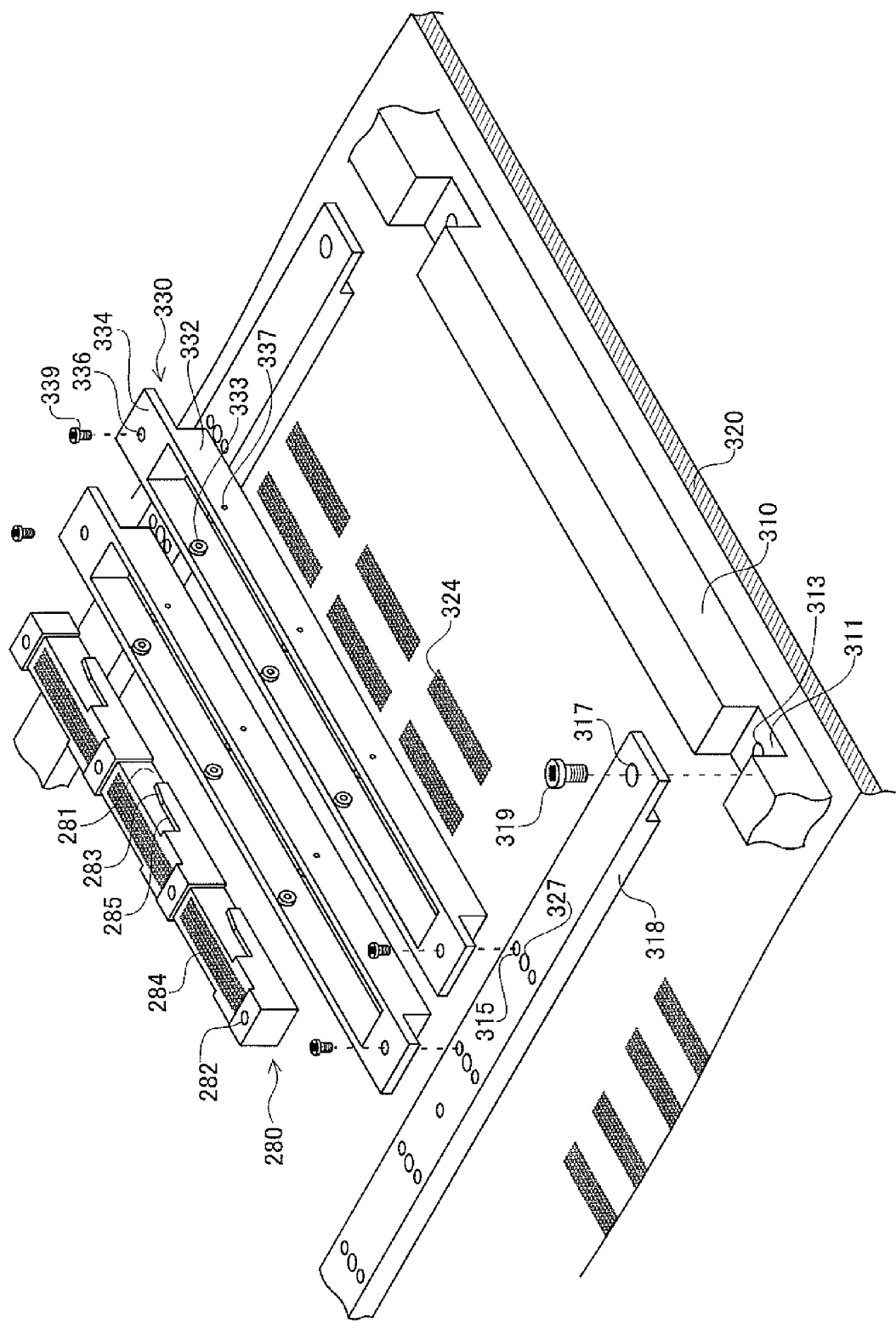
FIG. 18 is an exploded perspective view showing the periphery of a guide unit 330.

FIG. 18 is an exploded perspective view showing the periphery of a guide unit 330. Since this drawing includes the same structure as already explained for the testing apparatus 100, the elements common to the other drawings are assigned the same reference numerals and not explained below.

This drawing shows the test head 200 side solely by the contactor housing 280. Moreover, the probe card 300 side is shown by the stiffener 310, the circuit board 320, and the guide unit 330.

The contactor housing 280 has substantially the same configuration as that shown in FIG. 11, except that the slope portion 283 and the flat portion 285 of the steps on the side surface are shorter. The position and the width of the passing portion is unchanged.

The stiffener 310 includes a crossing member 318. The crossing member 318 includes screw holes 317 at both ends thereof. The crossing member 318 is provided with two types of screw holes 315 and 327 at an interval equal to the interval of the guide units 330. Connecting portions 311 shaped to complement the edges of the crossing member 318 are provided on the upper surface of the stiffener 310. Furthermore, respective screw holes 313 are provided through the connecting portions 311.

The crossing member 318 is inserted to the screw hole 317, to be coupled with high rigidity with respect to the stiffener 310 by means of the screw 319 screwed into the screw hole 313. Accordingly, the stiffener 310 and the crossing member 318 are integrated to each other, to provide high rigidity. An example how the screw hole 327 is used is detailed below.

A guide unit 330 is integrally formed by a channel member 332, a roller 333, and a link 334. The channel member 332 has an opening penetrating from the upper surface to the lower surface, and includes a pair of side walls parallel to each other. The plurality of rollers 333 are provided at a constant interval on the inner surface of the side wall of the channel member 332. Each of the rollers 333 is rotatably attached by means of the spindle 337. Note that the roller 333 does not move in this guide unit 330.

Links 334 is provided outside the both ends of the guide unit 330 in the lengthwise direction, and respectively include a screw 336. By inserting the screw 339 in the screw hole 336, to screw the screw 339 further into the screw hole 315 of the crossing member 318, the guide unit 330 can be fixed to the crossing member 318.

The circuit board 320 includes a plurality of groups of pads 324 on the upper surface, which are shown rather offset towards the right in the drawing. In this way, the circuit board 320 may further include a stiffener 310 and a crossing member 318 coupled to the guide units 330, to bias the guide units 330 in the direction of the circuit board 320.

Figure 19:
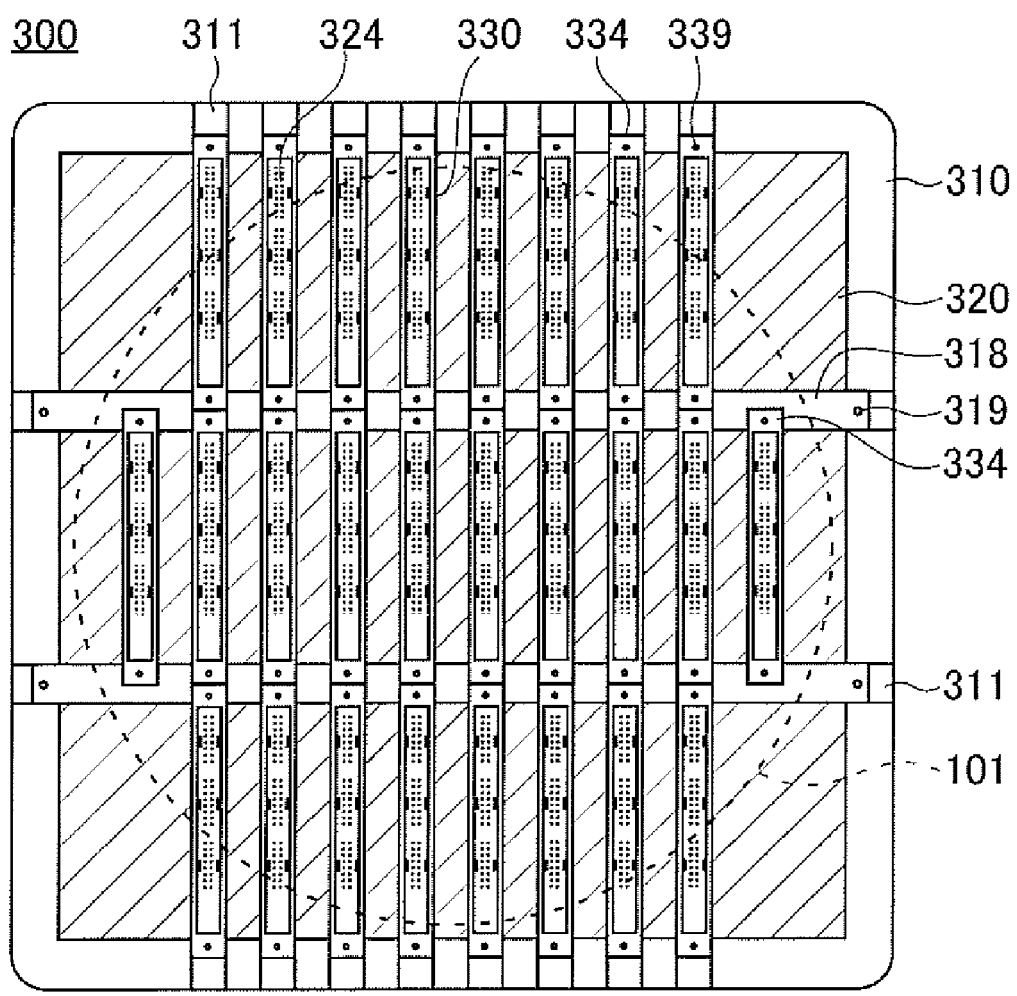
FIG. 19 is a plan view of a probe card 300.

FIG. 19 is a plan view of a probe card 300. The probe card 300 includes a stiffener 310, a circuit board 320, and a guide unit 330.

The stiffener 310 is in the form of a rectangular frame. Two crossing members 318 are assembled to the stiffener 310 to be parallel to the upper side and the lower side of the stiffener 310. The both ends of the crossing member 318 are screwed to the connecting portions 311 of the stiffener 310 respectively by screws 319.

A plurality of guide units 330 are further provided to be orthogonal to the crossing members 318. A guide unit 330 provided between a pair of crossing members 318 has the connecting portions 334 at both ends screwed to the crossing member 318 by means of screws 339.

Moreover, a guide unit 330 provided between the upper side (or the lower side) of the stiffener 310 and the crossing member 318 has one of the links 334 screwed to the stiffener 310 and the other of the links 334 screwed to the crossing member 318, respectively by means of screws 339. Note that for pursuing this, the connecting portions 311 for the links 334 of the guide units 330 are formed on the upper side and the lower side of the stiffener 310.

The pad groups 324 are positioned inside the guide units 330 fixed to the stiffener 310 and the crossing member 318. Here, the pad groups 324 are provided to be offset towards one end of the lengthwise direction of the guide unit 330 (upward direction in the drawing).

In this way, provided is a probe card 300 for electrically connecting the contactor 202 of the testing apparatus 100 to the test pads of the wafer 101, the prove card 300 comprising: a circuit board 320 having pad groups 324 corresponding to the test pads on its upper surface; and guide units 330 that press the spring pins 286 of the contactor 202 to the pad groups 324 of the circuit board 320.

Figure 20:
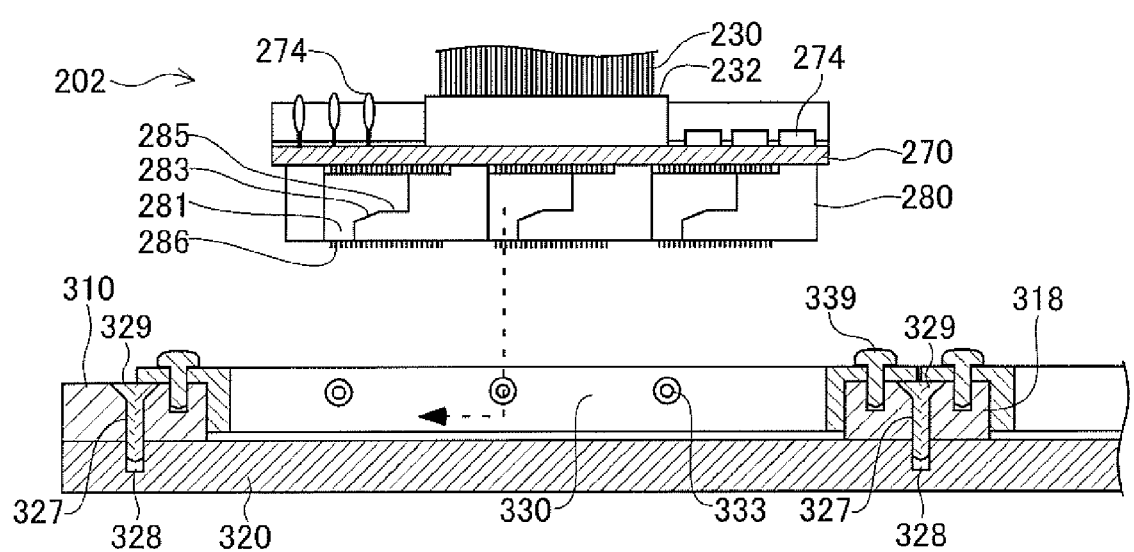
FIG. 20 is a schematic view of an operation performed by a contactor 202.

FIG. 20 is a schematic view of an operation performed by a contactor 202 directed to the probe card 300 stated above. The circuit board 320 forming the upper surface of the probe card 300 is screwed to be fixed by the screw 329 inserted into the screw hole 327 of the stiffener 310 or the crossing member 318.

Here, the circuit board 320 is provided with a non-through hole 328, as a screw hole in which the screw 329 is screwed. In this way, by making the screw hole to be a non-through hole 328, the inside of the probe card 300 can be maintained airtight by preventing the front and rear surfaces of the circuit board 320 from communicating each other via the screw hole.

For providing electric connection to the above-described probe card 300, the contactor 202 are lowered vertically toward the circuit board 320 as shown by the dotted line in the drawing, at the point where the roller 333 passes through the passing portion 281 of the contactor housing 280. The contactor housing 280, having been lowered to the point at which the lower end of the spring pin 286 protruding onto the lower surface of the contactor housing 280 abuts on the upper surface of the circuit board 320, is guided by the guide unit 330, to move horizontally along the surface of the circuit board 320.

Here, by sliding horizontally the contactor housing 280 so that the roller 333 passes upon the slope portion 283 to reach the flat portion 285, the guide unit 330 can be pressed against the circuit board 320 at the side surface of the contactor housing 280 having accommodated therein the spring pin 286.

The spring pin 286 eventually abuts on the corresponding contact pad 321 from among the pad groups 324 provided to be offset. Accordingly, an electric signal path from the probe card 300 to the contactor 202 is formed. In addition, because of the self cleaning effect by the sliding of the spring pin 286 with respect to the circuit board 320, the oxidation film or the like of the spring pin 286 and the contact pad 321 is removed, thereby obtaining a favorable connection between the spring pin 286 and the contact pad 321.

Note that the examples shown in FIG. 11 and FIG. 18 both had a structure such that the contactor housing 280 having steps on the side surface and the guide unit 330 including the roller 333 press the spring pin 286 to the contact pad 321. On the other hand, in the following example, an engaging pin is provided on a side surface of the contactor housing 280, and a groove cam is provided on the probe card 300.

Figure 21:
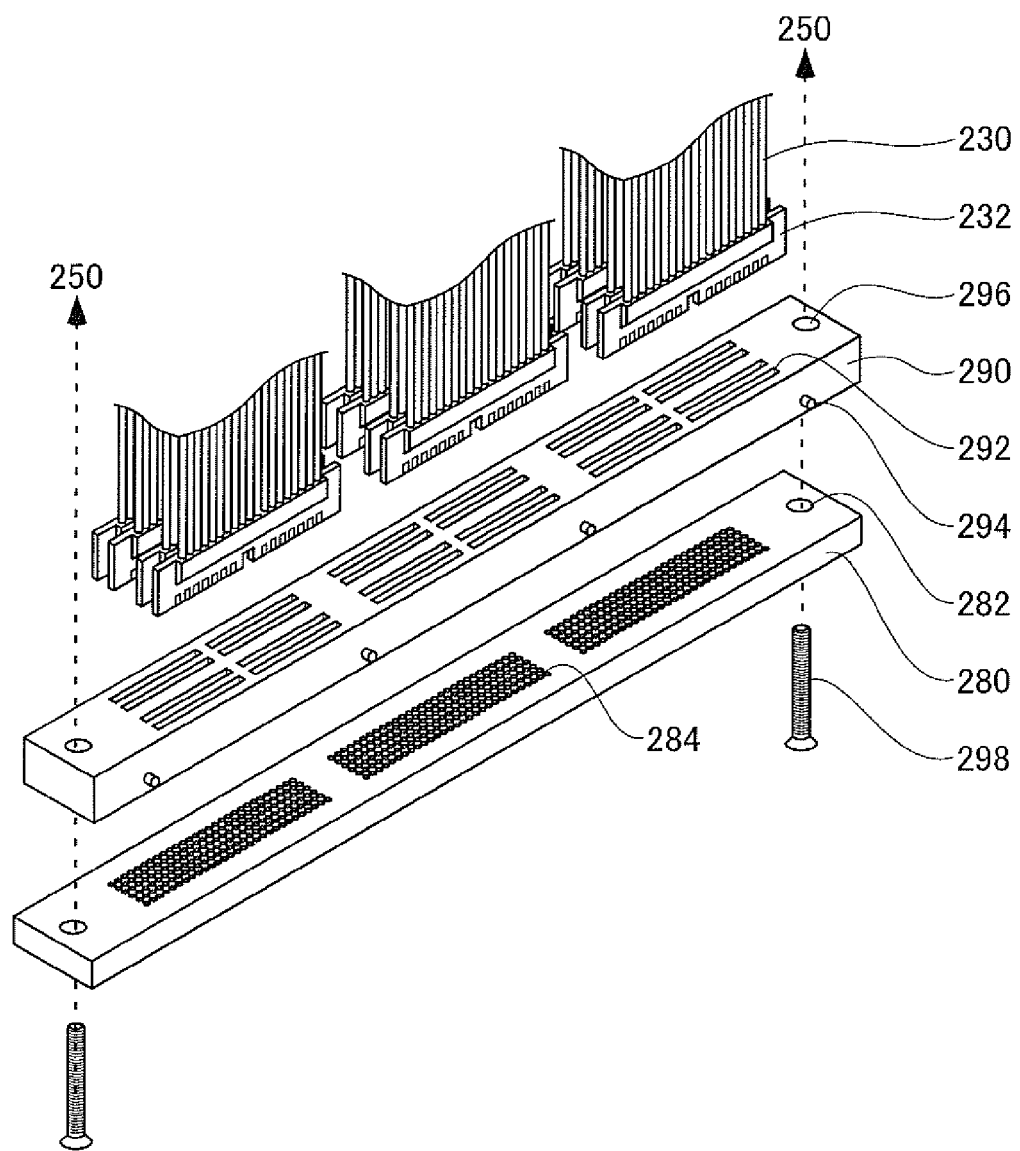
FIG. 21 is a perspective view of another structure in the periphery of the contactor 202.

FIG. 21 is a perspective view of another structure in the periphery of the contactor 202 in the test head 200 of the testing apparatus 100. The contactor 202 includes a contactor housing 280 and a socket 290.

The contactor housing 280 includes a housing hole 284 and a screw hole 282. There are a plurality of housing holes 284 provided through the contactor housing 280 in the height direction. A spring pin 286 is inserted to each of the housing holes 284. The screw hole 282 also penetrates the contactor housing 280 in the thickness direction. A screw 298 is inserted into the screw hole 282 from below.

The socket 290 includes a receptacle 292, an engaging pin 294, and a screw hole 296. The receptacle 292 has a shape complementing the shape of the connector housing 232 mounted at the lower end of the flat cable 230.

The screw hole 296 penetrates the socket 290 in the height direction. A tip of the screw 298 inserted to the screw hole 282 of the contactor housing 280 is further inserted to the screw hole 296. The upper end of the screw 298 is coupled to the three-dimensional actuator 250 of the test head 200. Accordingly, the contactor housing 280 is mounted to the test head 200, and is raised/lowered, or moved in the horizontal direction as the three-dimensional actuator 250 is operated.

The contactor housing 280 is stacked to be in close contact with the socket 290, and is in electric connection with it by wiring not shown in the drawings. Accordingly, an end of the flat cable 230 connected to the test head 200 is electrically coupled to the spring pin 286 of the contactor housing 280.

The engaging pin 294 protrudes in the vertical direction from a side surface of the socket 290. The function of the engaging pin 294 is detailed later.

Figure 22:
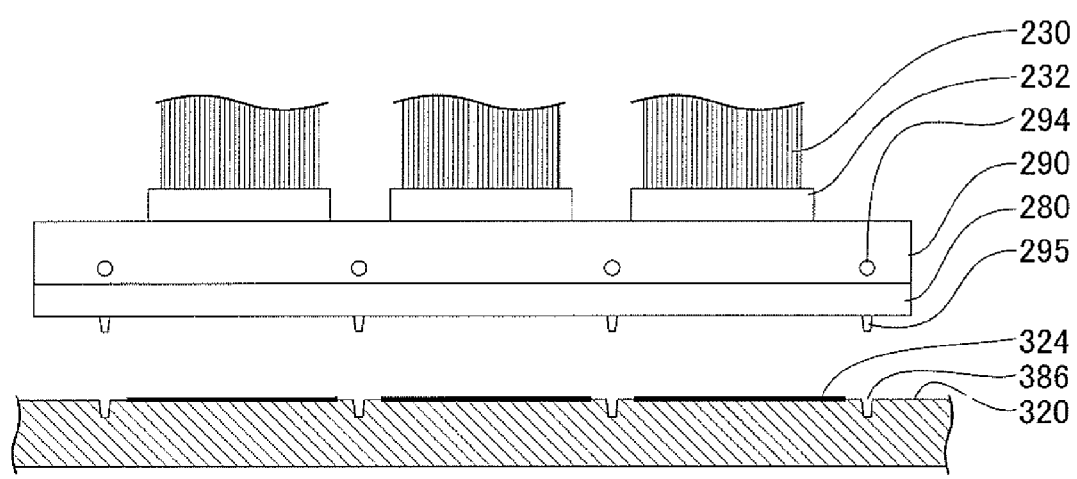
FIG. 22 is a side view of the contactor 202.

FIG. 22 is a side view of the contactor 202. The elements common to FIG. 21 are assigned the same reference numerals and not explained below.

As shown in the drawing, the lower surface of the contactor housing 280 is provided with a plurality of guide pins 295 protruding downward. The guide pins 295 are fitted to the guide holes 386 provided on the upper surface of the later-detailed circuit board 320, to align the contactor housing 280 on the circuit board 320.

Figure 23:
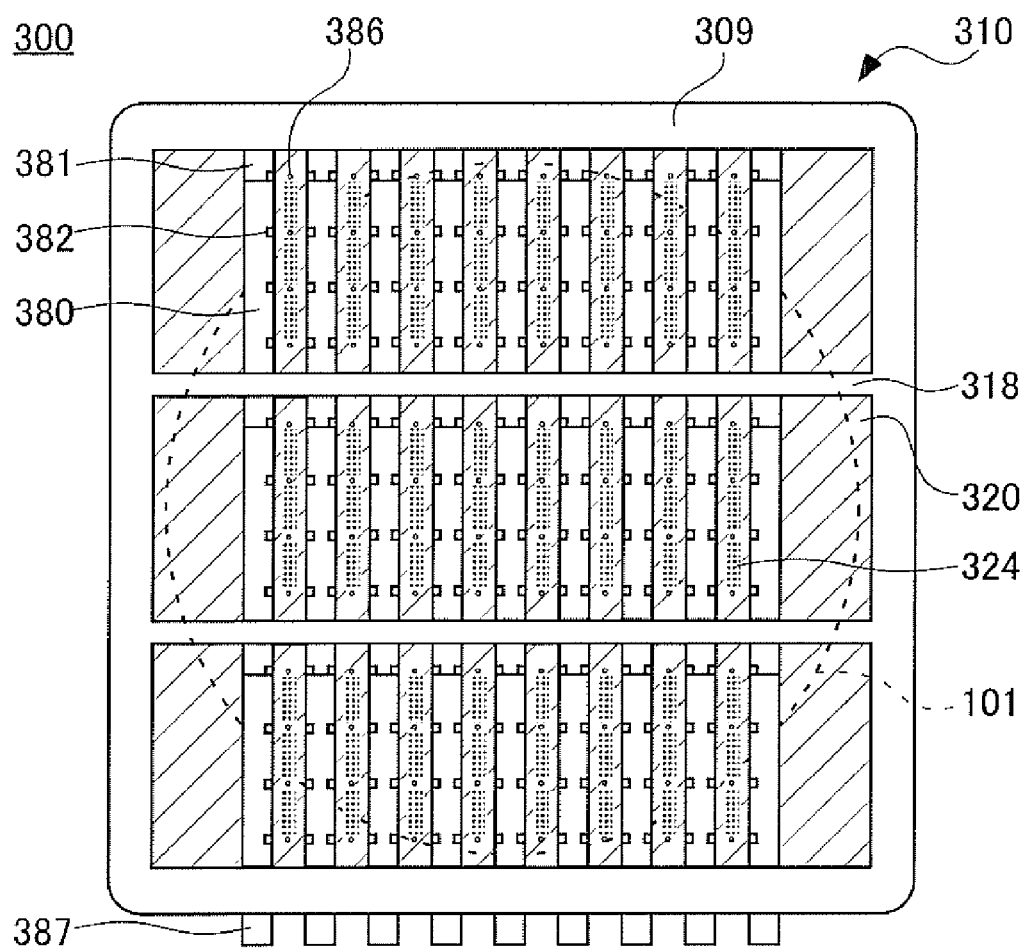
FIG. 23 is a plan view of the probe card 300.

FIG. 23 is a plan view of the probe card 300 corresponding to the contactor 202. The probe card 300 includes a stiffener 310, a circuit board 320, and a guide bar 380.

The circuit board 320 is shaped as a rectangle substantially circumscribing the wafer 101 to be tested. On the upper surface of the circuit board 320, a plurality of pad groups 324 and guide holes 386 are arranged regularly. The stiffener 310 is integrally formed by a frame 309 surrounding the entire circuit board 320 and a two crossing members 318 coupling a pair of parallel sides of the frame 309.

A plurality of guide bars 380 are provided to be parallel to each other, in the direction orthogonal to the crossing members 318 and at the same interval as the width of the contactor housing 280. Each of the guide bars 380 has a step 381 and a groove cam 382. The step 381 is formed adjacent to the stiffener 310, to have a reduced height compared to the other portions of the guide bar 380. The groove cam 382 is provided on a side surface of the guide bar 380.

Each of the crossing members 318 is longer than the depth of the stiffener 310 (the height in the drawing) as detailed later, to penetrate the frame 309 as well as the crossing member 318 of the stiffener 310. For this reason, the end 387 of the guide bar 380 protrudes from the lower end of the frame 309.

When the protruding end 387 is pressed in the lengthwise direction of the guide bar 380, the guide bar 380 moves in the direction it is pressed. As a result, the end 387 of the guide bar 380 enters the frame 309 of the stiffener 310, so that the upper end of the guide bar 380 protrudes from the upper end of the stiffener 310.

Figure 24:
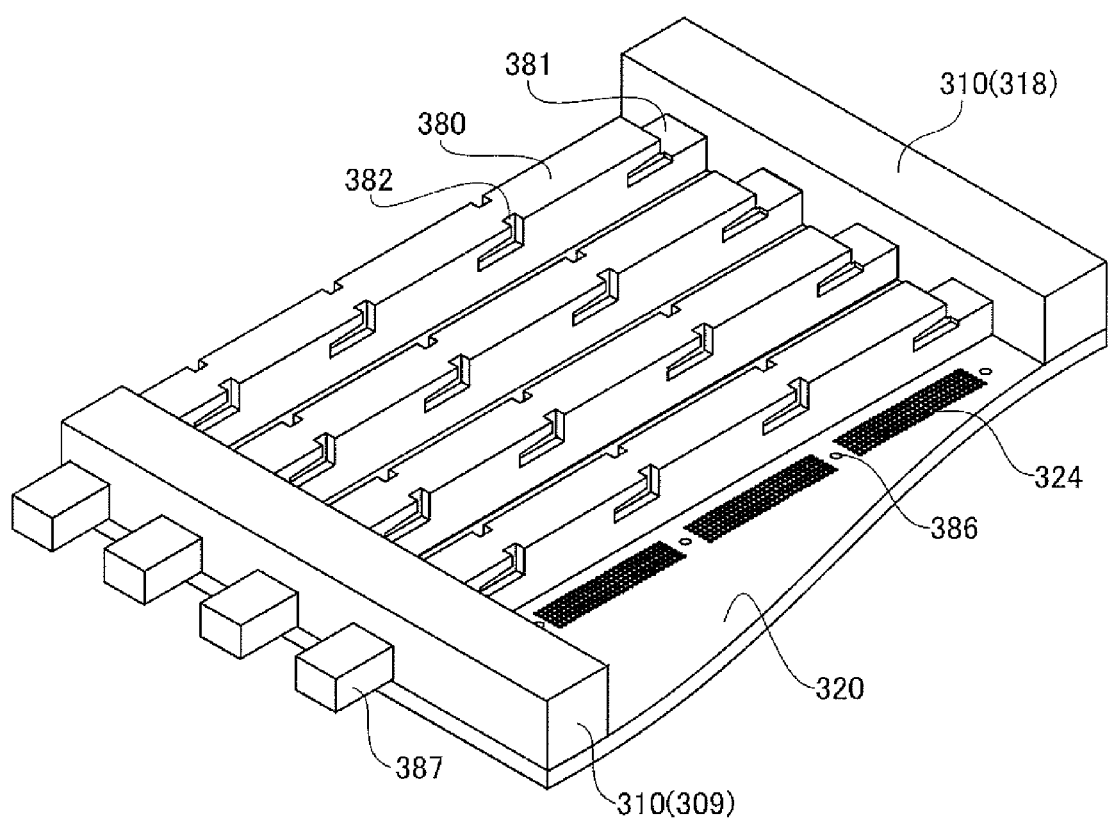
FIG. 24 is a partially enlarged perspective view of the probe card 300.

FIG. 24 is a partially enlarged perspective view of the probe card 300. The elements common to FIG. 23 are assigned the same reference numerals and not explained below.

Outside the stiffener 310, the end 387 of the guide bar 380 protrudes in the lower left direction from the frame 309 of the stiffener 310. Inside the stiffener 310 and opposite to the end 387, a step is provided prior to the crossing member 318 of the stiffener 310, to have a reduced height compared to the other portion of the guide bar 380. Accordingly, when the end 387 is pressed, the guide bar 380 moves until the raised surface of the step 381 abuts on the crossing member 318.

Each side surface of the guide bar 380 is provided with a groove cam 382 in an L-letter shape. The width of the entirety of each groove cam 382 is larger than the diameter of the engaging pin 294 provided on the side surface of the socket 290. Moreover, the inner surface of the groove cam 382 that faces downward has a slope that lowers towards the depth of the groove cam 382. The vertical portion of the groove cam 382 provided in a region overlapping the step 381 is not shown in the drawing, however the shape of its flat portion is the same as that of the other groove cams 382.

When the contactor 202 is lowered between the abovestated guide bars 380, the contactor housing 280 is guided by the guide bar 380 and the stiffener 310 to the side surface to be lowered, and eventually the lower end of the guide pin 295 enters the guide hole 386. By guiding the guide pin 295 through the guide hole 386, the lower end of the spring pin 286 held by the contactor housing 280 as well as the pad groups 324 are accurately aligned.

In addition, the engaging pin 294 provided on the side surface of the socket 290 enters inside the groove cam 382 of the guide bar 380. When the contactor 202 is lowered to the point that the engaging pin 294 reaches the bottom surface of the groove cam 382, the actuator not shown in the drawings collectively presses the ends 387 of the guide bars 380 in the lengthwise direction thereof. Accordingly, the groove cam 382 is also displaced, to press down the engaging pin 294 along the slope on its upper surface. In view of such an operation, the engaging pin 294 may have a structure of rolling, just as the roller 333.

The guide bar 380 is supported by being sandwiched between the stiffener 310 and the circuit board 320, and so the socket 290 and the contactor housing 280 are pulled towards the circuit board 320 in response to the above-explained operation. In this way, each of the spring pins 286 held by the contactor housing 280 is pressed against the pad forming the pad groups 324, to provide favorable electric connection between the pad and the spring pins 286.

In the structures shown from FIG. 21 through FIG. 24, the guide bar 380 performs both of guiding and pulling of the contactor housing 280. Therefore, this structure has a smaller number of parts and is simple, compared to the structures shown in FIG. 11 and FIG. 12, as well as FIG. 18 through FIG. 20, while enabling equal functions to those of the other embodiments.

Figure 25:
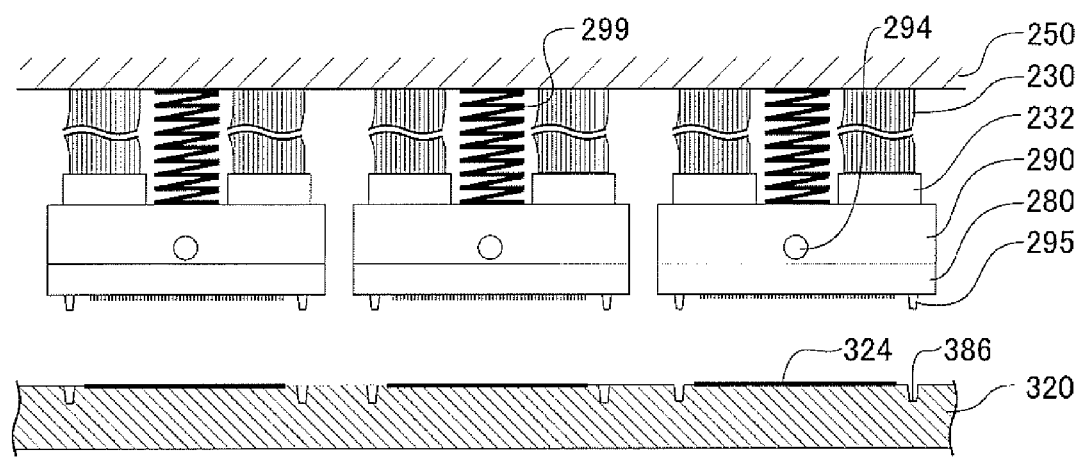
FIG. 25 is a side view showing a further different structure of the contactor 202.

FIG. 25 is a side view showing a further different structure of the contactor 202. In the examples shown up to FIG. 24, the spring pins 286 corresponding to the plurality of pad groups 324 are held by a single contactor housing 280.

As opposed to this, in the example of FIG. 25, each pad group 324 is provided with a different one of contactor housings 280. In addition, each of the contactor housings 280 and the sockets 290 is independently supported by the three-dimensional actuator 250 via the spring 299.

Accordingly, each of the contactor housings 280 is independently guided by a guide pin 295 to be aligned independently from one another, overlapping effect between the size error unavoidable for the circuit board 320 and the size error unavoidable for the contactor 202 is prevented. This helps maintain high positional accuracy throughout all the regions of the circuit board 320, to provide favorable electric connection.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A circuit board unit for connecting a connecting terminal of a testing apparatus to a connected terminal of a device under test, comprising:

a circuit board having, on one surface, a contact corresponding to the connected terminal; and a connector guide provided on the one surface of the circuit board, the connector guide contacting a connector having the connecting terminal and thereafter guiding the connector to the circuit board and pulling the connector towards the circuit board, wherein the circuit board includes either (i) a guide hole for receiving a guide pin of the connector to align the connector on the circuit board or (ii) a guide pin for receiving a guide hole of the connector to align the connector on the circuit board, and the connector guide includes a grooved portion to engage with an engaging pin of the connector, the engaging pin oriented substantially perpendicular to the guide pin, the engaging pin being brought into contact with the grooved portion and the grooved portion thereafter pressing down on the engaging pin due to an applied force acting substantially perpendicular to both the guide pin and the engaging pin.

2. The circuit board unit according to claim 1, wherein the connector guide biases the connector on a side of the connecting terminal, towards the circuit board.

3. The circuit board unit according to claim 1, wherein the circuit board further has a stiffener that is coupled to the connector guide and biases the connector guide towards the circuit board.

4. The circuit board unit according to claim 3, wherein the circuit board has a non-through hole into which a screw for coupling the stiffener is screwed.

5. The circuit board unit according to claim 1, further comprising:
 a first anisotropic conductive sheet having a front surface in contact with a rear surface of the one surface of the circuit board, and having electric conductivity solely in a thickness direction;
 an interposer having a front surface in contact with a rear surface of the first anisotropic conductive sheet, and converting a layout of the contact on the one surface to a layout of the connected terminal;
 a second anisotropic conductive sheet in contact with a rear surface of the interposer, and having electric conductivity solely in a thickness direction; and
 an elastic conductive sheet having a through electrode that penetrates front to rear surfaces and that biases the first anisotropic conductive sheet, the interposer, and the second anisotropic conductive sheet towards the circuit board.

6. The circuit board unit according to claim 1, wherein the connector guide pulls the connector towards a region corresponding to a rear surface of a region in which the circuit board unit contacts the device under test.

7. A circuit board unit for connecting a connecting terminal of a testing apparatus to a connected terminal of a device under test, comprising:
 a circuit board having, on one surface, a contact corresponding to the connected terminal; and
 a connector guide provided on the one surface of the circuit board, the connector guide contacting a connector having the connecting terminal and thereafter guiding the connector to the circuit board and pulling the connector towards the circuit board, wherein
 the connector guide includes either (i) one or more rollers that engage with a step portion of the connector and pull the connector to the circuit board or (ii) a step portion that engages with one or more rollers of the connector and pulls the connector to the circuit board.

8. The circuit board unit according to claim 7, wherein the connector guide includes one or more rollers that engage with a step portion of the connector and pull the connector to the circuit board, and
 the one or more rollers pass through a passing portion of the connector and engage with a slope portion and a flat portion of the connector that make up the step portion.

9. The circuit board unit according to claim 7, wherein the connector guide includes a step portion that engages with one or more rollers of the connector and pulls the connector to the circuit board, and
 the one or more rollers pass through a passing portion of the connector guide and engage with a slope portion and a flat portion of the connector guide that make up the step portion.

10. A testing apparatus for testing a device under test on a wafer, comprising:
 a connector having a connecting terminal for connecting a test circuit to a connected terminal of the device under test; and
 a circuit board unit that electrically connects the connecting terminal to the connected terminal, wherein the circuit board unit includes:
  a circuit board having, on one surface, a contact corresponding to the connected terminal; and
  a connector guide provided on the one surface of the circuit board, the connector guide contacting the connector and thereafter guiding the connector to the circuit board and pulling the connector towards the circuit board, wherein
 the connector guide includes either (i) one or more rollers that engage with a step portion of the connector and pull the connector to the circuit board or (ii) a step portion that engages with one or more rollers of the connector and pulls the connector to the circuit board.

11. The testing apparatus according to claim 10, wherein the connector guide includes one or more rollers that engage with a step portion of the connector and pull the connector to the circuit board, and
 the one or more rollers pass through a passing portion of the connector and engage with a slope portion and a flat portion of the connector that make up the step portion.

12. The testing apparatus according to claim 10, wherein the connector guide includes a step portion that engages with one or more rollers of the connector and pulls the connector to the circuit board, and
 the one or more rollers pass through a passing portion of the connector guide and engage with a slope portion and a flat portion of the connector guide that make up the step portion.

13. A testing apparatus for testing a device under test on a wafer, comprising:
 a connector having a connecting terminal for connecting a test circuit to a connected terminal of the device under test; and
 a circuit board unit that electrically connects the connecting terminal to the connected terminal, wherein the circuit board unit includes:
  a circuit board having, on one surface, a contact corresponding to the connected terminal; and
  a connector guide provided on the one surface of the circuit board, the connector guide contacting the connector and thereafter guiding the connector to the circuit board and pulling the connector towards the circuit board, wherein
 the circuit board includes either (i) a guide hole for receiving a guide pin of the connector to align the connector on the circuit board or (ii) a guide pin for receiving a guide hole of the connector to align the connector on the circuit board, and
 the connector guide includes a grooved portion to engage with an engaging pin of the connector, the engaging pin oriented substantially perpendicular to the guide pin, the engaging pin being brought into contact with the grooved portion and the grooved portion thereafter pressing down on the engaging pin due to an applied force acting substantially perpendicular to both the guide pin and the engaging pin.

14. The testing apparatus according to claim 13, wherein the connector guide biases the connector on a side of the connecting terminal, towards the circuit board.

15. The testing apparatus according to claim 13, wherein the circuit board further has a stiffener that is coupled to the connector guide and biases the connector guide towards the circuit board.

16. The testing apparatus according to claim 15, wherein the circuit board has a non-through hole into which a screw for coupling the stiffener is screwed.

17. The testing apparatus according to claim 13, wherein the circuit board unit further has:
- a first anisotropic conductive sheet having a front surface in contact with a rear surface of the one surface of the circuit board, and having electric conductivity solely in a thickness direction;
- an interposer having a front surface in contact with a rear surface of the first anisotropic conductive sheet, and converting a layout of the contact on the one surface to a layout of the connected terminal;
- a second anisotropic conductive sheet in contact with a rear surface of the interposer, and having electric conductivity solely in a thickness direction; and
- an elastic conductive sheet having a through electrode that penetrates front to rear surfaces and that biases the first anisotropic conductive sheet, the interposer, and the second anisotropic conductive sheet towards the circuit board.

18. The testing apparatus according to claim 13, wherein the connector guide pulls the connector towards a region corresponding to a rear surface of a region in which the circuit board unit contacts the device under test.

\* \* \* \* \*